United States Patent
Shelby et al.

(10) Patent No.: US 10,887,879 B2
(45) Date of Patent: *Jan. 5, 2021

(54) SCRAMBLING SEQUENCE DESIGN FOR EMBEDDING RECEIVER ID INTO FROZEN BITS FOR BLIND DETECTION

(71) Applicant: Coherent Logix, Incorporated, Austin, TX (US)

(72) Inventors: Kevin A. Shelby, Austin, TX (US); Feng Liu, Waterloo (CA)

(73) Assignee: Coherent Logix, Incorporated, Austin, TX (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/786,332

(22) Filed: Feb. 10, 2020

(65) Prior Publication Data

US 2020/0196286 A1      Jun. 18, 2020

Related U.S. Application Data

(63) Continuation of application No. 16/459,072, filed on Jul. 1, 2019, now Pat. No. 10,560,932, which is a
(Continued)

(51) Int. Cl.
  *H04W 72/04*    (2009.01)
  *H04L 27/26*    (2006.01)
  (Continued)

(52) U.S. Cl.
  CPC ......... *H04W 72/042* (2013.01); *H04L 1/0041* (2013.01); *H04L 1/0057* (2013.01);
  (Continued)

(58) Field of Classification Search
  CPC .......... H04W 72/042; H04W 72/0413; H04W 88/02; H04W 88/08; H04L 1/0041;
  (Continued)

(56) References Cited

U.S. PATENT DOCUMENTS

2015/0293716 A1    10/2015  Jiang
2016/0182187 A1    6/2016   Kim
(Continued)

FOREIGN PATENT DOCUMENTS

WO     2014/022860     2/2014

OTHER PUBLICATIONS

R1-1701384; "Chairman's notes of AI 5.1.5 channel coding"; TSG RAN WG1 Ad-Hoc Meeting; Jan. 16-20, 2017; 6 pages.
(Continued)

*Primary Examiner* — Ian N Moore
*Assistant Examiner* — Brian T Le
(74) *Attorney, Agent, or Firm* — Kowert, Hood, Munyon, Rankin & Goetzel, P.C.

(57) ABSTRACT

Methods and devices are described for encoding and decoding control information that has been modulated based on one or more identifiers of the transmitter and/or receiver. Some embodiments describe scrambling sequence design for multi-mode block discrimination on downlink control information (DCI) blind detection. Separate scrambling masks may be applied to disparate bit fields within a coded DCI message, wherein each of the scrambling masks is derived from a unique identifier associated with either the transmitter or the intended receiver. The scrambling masks may be used by the receiver to perform early termination of the decoding process, to mitigate intercell interference, and to verify that the receiver is the intended receiver.

20 Claims, 21 Drawing Sheets

Related U.S. Application Data continuation of application No. 15/852,761, filed on Dec. 22, 2017, now Pat. No. 10,383,106.

(60) Provisional application No. 62/442,225, filed on Jan. 4, 2017, provisional application No. 62/455,448, filed on Feb. 6, 2017, provisional application No. 62/501,493, filed on May 4, 2017, provisional application No. 62/521,946, filed on Jun. 19, 2017.

(51) Int. Cl.
    *H04L 25/03*     (2006.01)
    *H04L 29/08*     (2006.01)
    *H04W 88/02*     (2009.01)
    *H04W 88/08*     (2009.01)
    *H04L 1/00*     (2006.01)

(52) U.S. Cl.
    CPC .......... *H04L 1/0058* (2013.01); *H04L 1/0061* (2013.01); *H04L 1/0072* (2013.01); *H04L 25/03866* (2013.01); *H04L 27/2601* (2013.01); *H04L 69/324* (2013.01); *H04W 88/02* (2013.01); *H04W 88/08* (2013.01)

(58) Field of Classification Search
    CPC ... H04L 1/0058; H04L 1/0061; H04L 1/0072; H04L 25/03866; H04L 27/2601; H04L 1/0057; H04L 69/324
    See application file for complete search history.

(56) References Cited

U.S. PATENT DOCUMENTS

| | | |
|---|---|---|
| 2016/0269050 A1 | 9/2016 | Shen |
| 2017/0005753 A1 | 1/2017 | Shen |
| 2017/0012740 A1 | 1/2017 | Shen |
| 2017/0214416 A1 | 7/2017 | Ge |
| 2017/0364399 A1 | 12/2017 | Shi |
| 2018/0048418 A1 | 2/2018 | Ge |
| 2018/0192403 A1 | 7/2018 | Shelby |
| 2018/0199317 A1 | 7/2018 | Hwang |
| 2018/0248567 A1 | 8/2018 | Qu |
| 2018/0351579 A1 | 12/2018 | Hong |
| 2018/0367250 A1 | 12/2018 | Li |

OTHER PUBLICATIONS

R1-1700425; "Scalable Processing for Accelerated NR DCI Blind Detection"; Coherent Logix, Inc.; TSG RAN WG1 Ad-Hoc Meeting; Jan. 16-20, 2017; 7 pages.

R1-1700324; "Design of Polar Codes for Control Channel in NR"; AT&T; TSG RAN WG1 Ad-Hoc Meeting; Jan. 16-20, 2017; 3 pages.

Balatsoukas-Stimming, et al; "LLR-Based Successive Cancellation List Decoding of Polar Codes"; IEEE Transactions on Signal Processing; Mar. 6, 2015; 15 pages.

3GPP TS 36.211 V8.9.0; "Evolved Universal Terrestrial Radio Access (E-UTRA); Physical Channels and Modulation"; Dec. 1-4, 2009; 83 pages.

R1-1608862; "Polar Code Construction for NR"; Huawei, HiSilicon; 3GPP TSG RAN WG1 Meeting #86bis; Oct. 10-14, 2016; 8 pages.

Huawei et al.; "Evaluation of channel coding schemes for control channel"; 3GPP Draft; RI-1608863; 3rd Generation Partnership Project (3GPP); Mobile Competence Centre, 650, Route Des Lucioles; F-06921, Sophia-Anti Poli, France; vol. RAN WGI, No. Lisbon, Portugal; Oct. 1, 2016; 10 pages.

LG Electronics; "Scrambling of downlink control channel"; 3GPP Draft; RI-1717978; 3rd Generation Partnership Project (3GPP); Mobile Competence Centre, 650, Route Des Lucioles; F-06921 Sophia-Antipolis Cedex, France; vol. RAN WGI, No. Prague, Czech Republic; Oct. 8, 2017; 4 pages.

International Search Report and Written Opinion, Application No. PCT/US2017/068972, dated Apr. 5, 2018, 18 pages.

$$S_{0:F-1} \ O_{0:D-1} \ O_{0:15}$$
$$+$$
$$O_{0:F-1} \ r_{0:D-1} \ O_{0:15}$$
$$+$$
$$O_{0:F-1} \ O_{0:D-1} \ X_{0:15}$$
$$=$$
$$W_{0:F-1} \ W_{F:A-1} \ W_{A:A+15}$$

$$G_n = F_N \triangleq (F_2)^{\otimes n}$$

$$\begin{pmatrix} S_0 \\ S_1 \\ S_2 \\ \vdots \\ S_{N-1} \end{pmatrix} + \begin{pmatrix} R_0 \\ R_1 \\ R_2 \\ \vdots \\ R_{N-1} \end{pmatrix} + \begin{pmatrix} X_0 \\ X_1 \\ X_2 \\ \vdots \\ X_{N-1} \end{pmatrix} = \begin{pmatrix} wG_0 \\ wG_1 \\ wG_2 \\ \vdots \\ wG_{N-1} \end{pmatrix} = \begin{pmatrix} W_0 \\ W_1 \\ W_2 \\ \vdots \\ W_{N-1} \end{pmatrix}$$

FIG. 18

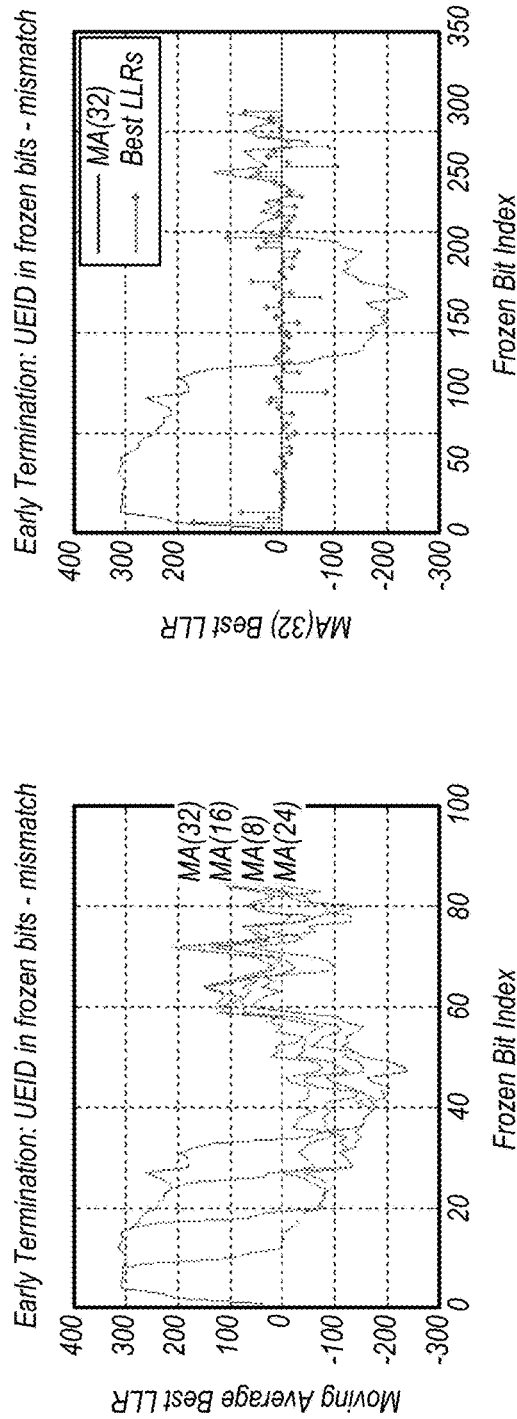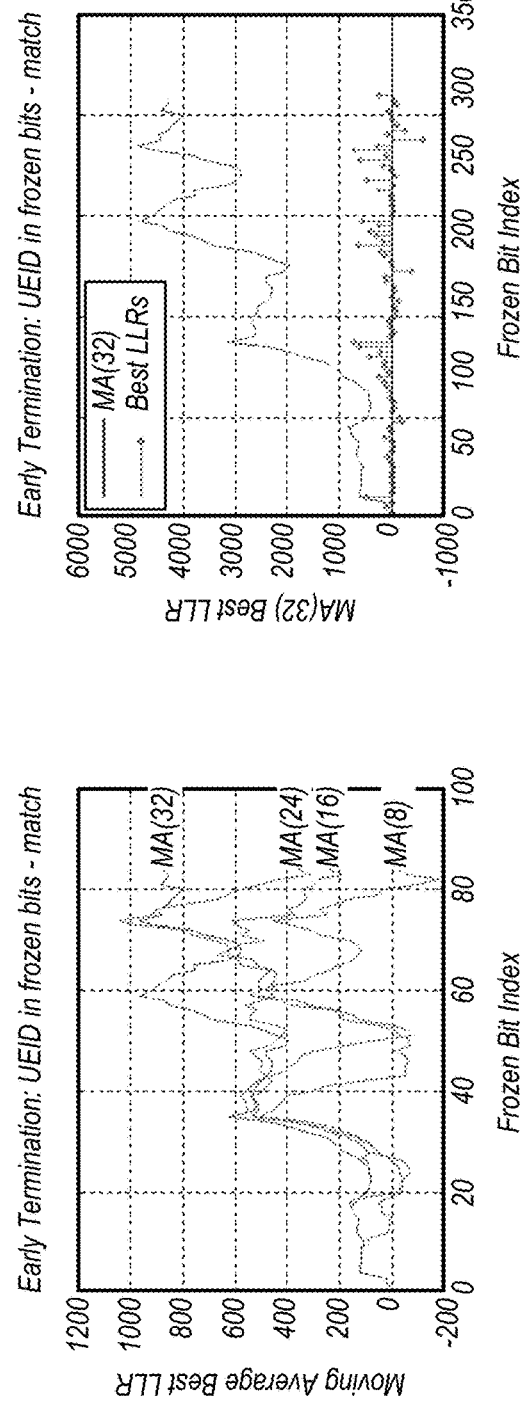
FIG. 19
Moving average, best LLRs, R=1/12, K=40, QPSK

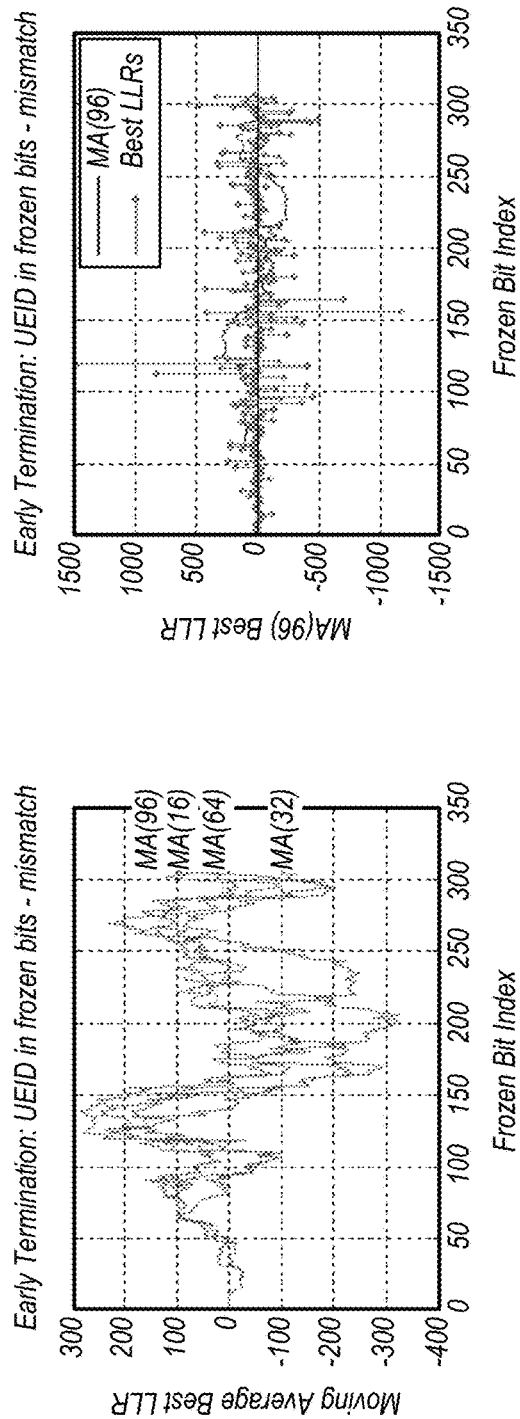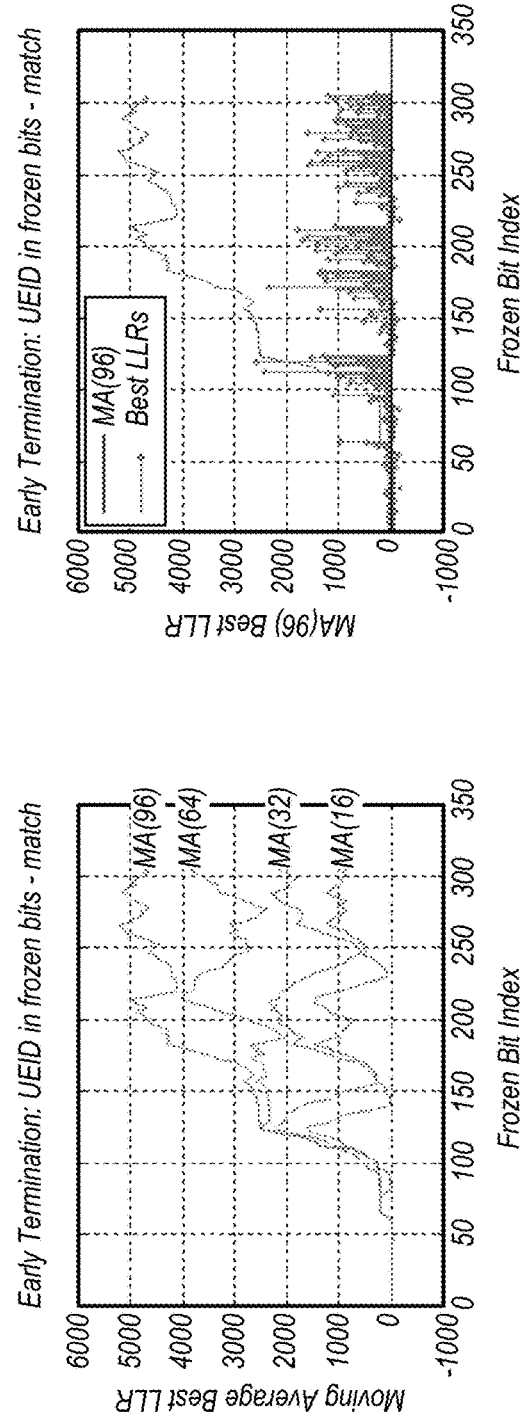
FIG. 20
Running average, best LLRs, R=1/3, K=200, QPSK

SCRAMBLING SEQUENCE DESIGN FOR EMBEDDING RECEIVER ID INTO FROZEN BITS FOR BLIND DETECTION

PRIORITY CLAIM

This application is a continuation of U.S. application Ser. No. 16/459,072 titled "Scrambling Sequence Design for Embedding UE ID into Frozen Bits for DCI Blind Detection" and filed on Jul. 1, 2019, which claims benefit of priority to U.S. application Ser. No. 15/852,761 titled "Scrambling Sequence Design for Embedding UE ID into Frozen Bits for DCI Blind Detection" and filed on Dec. 22, 2017, which claims benefit of priority to U.S. Provisional Application No. 62/442,225 titled "Early Termination with Polar Codes for eMBB DCI Blind Detection" and filed on Jan. 4, 2017, U.S. Provisional Application No. 62/455,448 titled "Early Block Discrimination with Polar Codes to Further Accelerate DCI Blind Detection" and filed on Feb. 6, 2017, U.S. Provisional Application No. 62/501,493 titled "Early Block Discrimination with Polar Codes to Further Accelerate DCI Blind Detection" and filed on May 4, 2017, and U.S. Provisional Application No. 62/521,946 titled "Scrambling Sequence Design for Multi-Mode Block Discrimination on DCI Blind Detection" and filed on Jun. 19, 2017, all of which are hereby incorporated by reference in their entirety as if fully and completely set forth herein.

The claims in the instant application are different than those of the parent application and/or other related applications. The Applicant therefore rescinds any disclaimer of claim scope made in the parent application and/or any predecessor application in relation to the instant application. Any such previous disclaimer and the cited references that it was made to avoid, may need to be revisited. Further, any disclaimer made in the instant application should not be read into or against the parent application and/or other related applications.

FIELD OF THE INVENTION

The field of the invention generally relates to encoders and decoders used in wireless communications.

DESCRIPTION OF THE RELATED ART

Decoders are used in many areas of wireless communications. A transmitter may encode a message which is intended for reception by a specific receiver. If the intended receiver does not have a priori knowledge of where (e.g., where in time and/or frequency) to look for the encoded message, it may undergo a blind decoding procedure to search a set of candidate locations for the intended message.

Blind decoding can take considerable time and computational resources, as the receiver may have to perform blind decoding on messages in a large number of candidate locations before the correct message is decoded. Accordingly, improvements in the field are desired.

SUMMARY OF THE EMBODIMENTS

Various embodiments are described of systems and methods for encoding and decoding control information that has been modulated based on one or more identifiers of the transmitter and/or receiver. Some embodiments describe scrambling sequence design for multi-mode block discrimination on downlink control information (DCI) blind detection. Separate scrambling masks may be applied to disparate bit fields within a coded DCI message, wherein each of the scrambling masks is derived from a unique identifier associated with either the transmitter or the intended receiver. The scrambling masks may be used by the receiver to perform early termination of the decoding process, to mitigate intercell interference, and to verify that the receiver is the intended receiver.

BRIEF DESCRIPTION OF THE DRAWINGS

A better understanding of the present invention can be obtained when the following detailed description of the preferred embodiment is considered in conjunction with the following drawings, in which:

FIG. 18 illustrates a successive bit-mask assignment, according to some embodiments;

FIG. 19 illustrates data using a moving average to obtain early block discrimination for a mismatch (top) and match (bottom), according to some embodiments;

FIG. 20 illustrates the effect of bit feedback on match identification using a running average to obtain early termination for a mismatch (top) and match (bottom), according to some embodiments.

Figure 1:
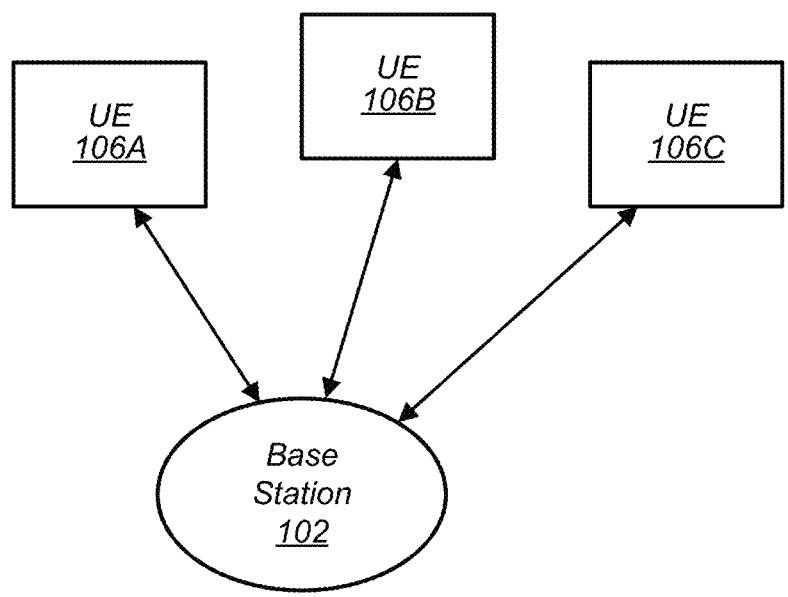
FIG. 1 is a diagram illustrating a wireless communication environment, according to some embodiments.

While the invention is susceptible to various modifications and alternative forms, specific embodiments thereof are shown by way of example in the drawings and are herein described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS OF THE INVENTION

Incorporation by Reference

The following references are hereby incorporated by reference in their entirety as though fully and completely set forth herein:

1. "Polar Code Construction for NR", Huawei, HiSilicon, 3GPP TSG RAN WG1 Meeting #86bis, October 2016.
2. Alexios Balatsoukas-Stimming, Mani Bastani Parizi, and Andreas Burg, "LLR-Based Successive Cancellation List Decoding of Polar Codes", IEEE Transactions on Signal Processing, October 2015.
3. 3GPP TS 36.211: "Evolved Universal Terrestrial Radio Access (E-UTRA); Physical Channels and Modulation".
4. Provisional Patent Application No. 62/455,448, titled "Early Block Discrimination with Polar Codes to Further Accelerate DCI Blind Detection".
5. Provisional Patent Application number 62/501,493, titled "Early Block Discrimination with Polar Codes to Further Accelerate DCI Blind Detection".
6. U.S. patent application Ser. No. 15/359,845, titled "Memory Management and Path Sort Techniques in a Polar Code Successive Cancellation List Decoder".

Terms

The following is a glossary of terms used in the present application:

Memory Medium—Any of various types of memory devices or storage devices. The term "memory medium" is intended to include an installation medium, e.g., a CD-ROM, floppy disks, or tape device; a computer system memory or random access memory such as DRAM, DDR RAM, SRAM, EDO RAM, Rambus RAM, etc.; or a non-volatile memory such as a magnetic media, e.g., a hard drive, optical storage, or ROM, EPROM, FLASH, etc. The memory medium may comprise other types of memory as well, or combinations thereof. In addition, the memory medium may be located in a first computer in which the programs are executed, and/or may be located in a second different computer which connects to the first computer over a network, such as the Internet. In the latter instance, the second computer may provide program instructions to the first computer for execution. The term "memory medium" may include two or more memory mediums which may reside in different locations, e.g., in different computers that are connected over a network.

Carrier Medium—a memory medium as described above, as well as a physical transmission medium, such as a bus, network, and/or other physical transmission medium that conveys signals such as electrical or optical signals.

Programmable Hardware Element—includes various hardware devices comprising multiple programmable function blocks connected via a programmable or hardwired interconnect. Examples include FPGAs (Field Programmable Gate Arrays), PLDs (Programmable Logic Devices), FPOAs (Field Programmable Object Arrays), and CPLDs (Complex PLDs). The programmable function blocks may range from fine grained (combinatorial logic or look up tables) to coarse grained (arithmetic logic units or processor cores). A programmable hardware element may also be referred to as "reconfigurable logic".

Application Specific Integrated Circuit (ASIC)—this term is intended to have the full breadth of its ordinary meaning. The term ASIC is intended to include an integrated circuit customized for a particular application, rather than a general purpose programmable device, although an ASIC may contain programmable processor cores as building blocks. Cell phone chips, MP3 player chips, and many other single-function ICs are examples of ASICs. An ASIC is usually described in a hardware description language such as Verilog or VHDL.

Program—the term "program" is intended to have the full breadth of its ordinary meaning. The term "program" includes 1) a software program which may be stored in a memory and is executable by a processor or 2) a hardware configuration program useable for configuring a programmable hardware element or ASIC.

Software Program—the term "software program" is intended to have the full breadth of its ordinary meaning, and includes any type of program instructions, code, script and/or data, or combinations thereof, that may be stored in a memory medium and executed by a processor. Exemplary software programs include programs written in text-based programming languages, e.g., imperative or procedural languages, such as C, C++, PASCAL, FORTRAN, COBOL, JAVA, assembly language, etc.; graphical programs (programs written in graphical programming languages); assembly language programs; programs that have been compiled to machine language; scripts; and other types of executable software. A software program may comprise two or more software programs that interoperate in some manner.

Hardware Configuration Program—a program, e.g., a netlist or bit file, that can be used to program or configure a programmable hardware element or ASIC.

Computer System—any of various types of computing or processing systems, including a personal computer system (PC), mainframe computer system, workstation, network appliance, Internet appliance, personal digital assistant (PDA), grid computing system, or other device or combinations of devices. In general, the term "computer system" can be broadly defined to encompass any device (or combination of devices) having at least one processor that executes instructions from a memory medium.

Automatically—refers to an action or operation performed by a computer system (e.g., software executed by the computer system) or device (e.g., circuitry, programmable hardware elements, ASICs, etc.), without user input directly specifying or performing the action or operation. Thus the term "automatically" is in contrast to an operation being manually performed or specified by the user, where the user provides input to directly perform the operation. An automatic procedure may be initiated by input provided by the user, but the subsequent actions that are performed "automatically" are not specified by the user, i.e., are not performed "manually", where the user specifies each action to perform. For example, a user filling out an electronic form by selecting each field and providing input specifying information (e.g., by typing information, selecting check boxes, radio selections, etc.) is filling out the form manually, even though the computer system must update the form in response to the user actions. The form may be automatically filled out by the computer system where the computer system (e.g., software executing on the computer system) analyzes the fields of the form and fills in the form without any user input specifying the answers to the fields. As indicated above, the user may invoke the automatic filling of the form, but is not involved in the actual filling of the form (e.g., the user is not manually specifying answers to fields but rather they are being automatically completed). The present specification provides various examples of operations being automatically performed in response to actions the user has taken.

DETAILED DESCRIPTION

FIG. 1—Wireless Communication Environment

FIG. 1 illustrates an exemplary (and simplified) wireless environment that includes multiple communication systems. FIG. 1 shows an example communication system involving a base station (BS) 102 communicating with a plurality of user equipment devices (UEs) 106A-C. The base station 102 may be a cellular base station which performs cellular communications with a plurality of wireless communication devices. Alternatively, the base station 102 may be a wireless access point for performing Wi-Fi communications, such as according to the 802.11 standard or related standards. The UEs 106 may be any of various devices such as a smart phone, tablet device, computer system, etc. One or both of the base station 102 and the wireless communication device 106 may include decoder logic as described herein.

In the illustrated embodiment, different UEs and the base station are configured to communicate via a broadcast network and/or a packet-switched cellular network. It is noted that the system of FIG. 1 is merely one example of possible systems, and embodiments may be implemented in any of various systems, as desired.

Cellular base station 102 may be a base transceiver station (BTS) or cell site, and may include hardware that enables wireless communication with the UEs 106A-C. The base station 102 may also be configured to communicate with a core network. The core network may be coupled to one or more external networks, which may include the Internet, a Public Switched Telephone Network (PSTN), and/or any other network. Thus, the base station 102 may facilitate communication between the UE devices 106A-C and a network.

Base station 102 and other base stations operating according to the same or different radio access technologies (RATs) or cellular communication standards may be provided as a network of cells, which may provide continuous or nearly continuous overlapping service to UEs 106A-C and similar devices over a wide geographic area via one or more RATs.

The base station 102 may be configured to broadcast communications to the UEs 106A-C. The term "broadcast" herein may refer to one-to-many transmissions that are transmitted for receiving devices in a broadcast area rather than being addressed to a particular device. Further, broadcast transmissions are typically unidirectional (from transmitter to receiver). In some situations, control signaling (e.g., ratings information) may be passed back to a broadcast transmitter from the receivers, but the content data is transmitted in only one direction. In contrast, cellular communication is typically bi-directional. "Cellular" communications also may involve handoff between cells. For example, when UE 106A (and/or UEs 106B-C) moves out of the cell served by cellular base station 102, it may be handed over to another cellular base station (and the handover may be handled by the network, including operations performed by base station 102 and the other cellular base station). In contrast, when a user moves from the range covered by a first broadcast base station to the range covered by a second broadcast base station, it may switch to receiving content from the second broadcast base station, but the base stations do not need to facilitate handover (e.g., they simply continue broadcasting and do not care which base station a particular UE is using).

Traditionally, broadcast transmissions are performed using different frequency resources than cellular transmissions. In some embodiments, however, frequency resources are shared between these different types of transmissions. For example, in some embodiments, a broadcast base station is configured to relinquish one or more frequency bands during scheduled time intervals for use by a cellular base station for packet-switched communications.

In some embodiments, control signaling transmitted by a broadcast or cellular base station may allow end user devices to maintain full signaling connectivity (which may eliminate network churn), extend battery life (e.g., by determining when to remain in a low power mode when a base station is not transmitting), and/or actively manage coverage detection (e.g., rather than perceiving spectrum sharing periods as spotty coverage or a temporary network outage).

The base station 102 and the UEs 106A, 106B, and 106C may be configured to communicate over the transmission medium using any of various RATs (also referred to as wireless communication technologies or telecommunication standards), such as LTE, 5G New Radio (NR), Next Generation Broadcast Platform (NGBP), W-CDMA, TDS-CDMA, and GSM, among possible others such as UMTS, LTE-A, CDMA2000 (e.g., 1×RTT, 1×EV-DO, HRPD, eHRPD), Advanced Television Systems Committee (ATSC) standards, Digital Video Broadcasting (DVB), etc.

Broadcast and cellular networks are discussed herein to facilitate illustration, but these technologies are not intended to limit the scope of the present disclosure and the disclosed spectrum sharing techniques may be used between any of various types of wireless networks, in other embodiments.

Figure 2:
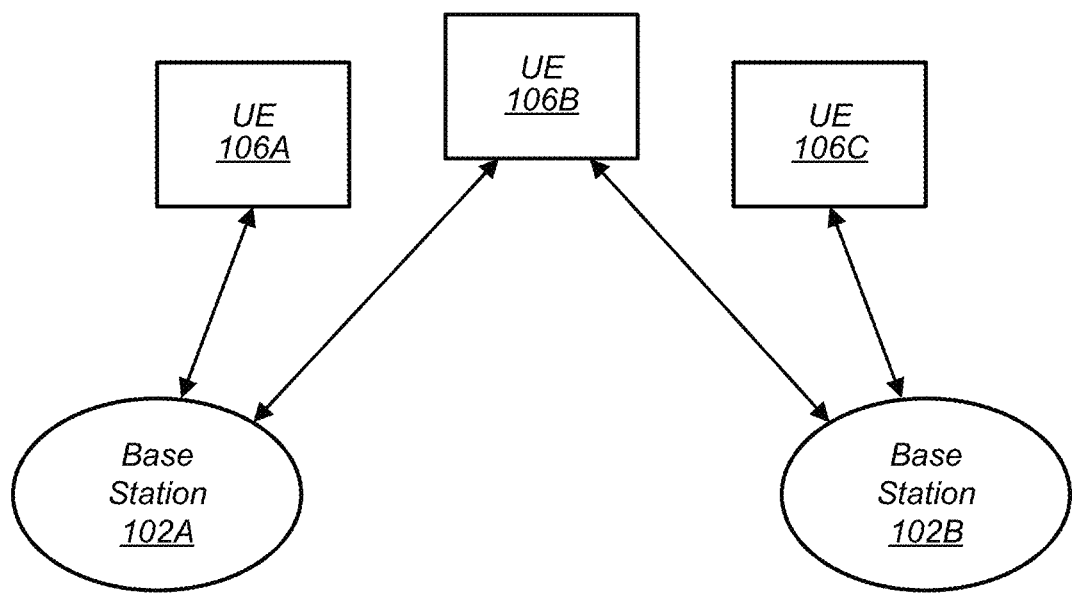
FIG. 2 is a diagram illustrating a wireless communication environment with base station coverage overlap, according to some embodiments.

FIG. 2—Wireless Communication Environment with Multiple Base Stations

FIG. 2 illustrates an exemplary wireless communication system that includes base stations 102A and 102B which communicate over a transmission medium with one or more user equipment (UE) devices, represented as UEs 106A-106C. The communication environment in FIG. 2 may function similarly to that described in FIG. 1, above. However, FIG. 2 illustrates that the center UE 106B may operate within range of both of the base stations 102A and 102B. In these embodiments, UE 106B may mistakenly receive a communication from base station 102B when it was intending to receive communications from base station 102A. This effect may be referred to as intercell interference, and embodiments herein describe novel methods for efficiently avoiding intercell interference in cell coverage overlap areas.

Figure 3:
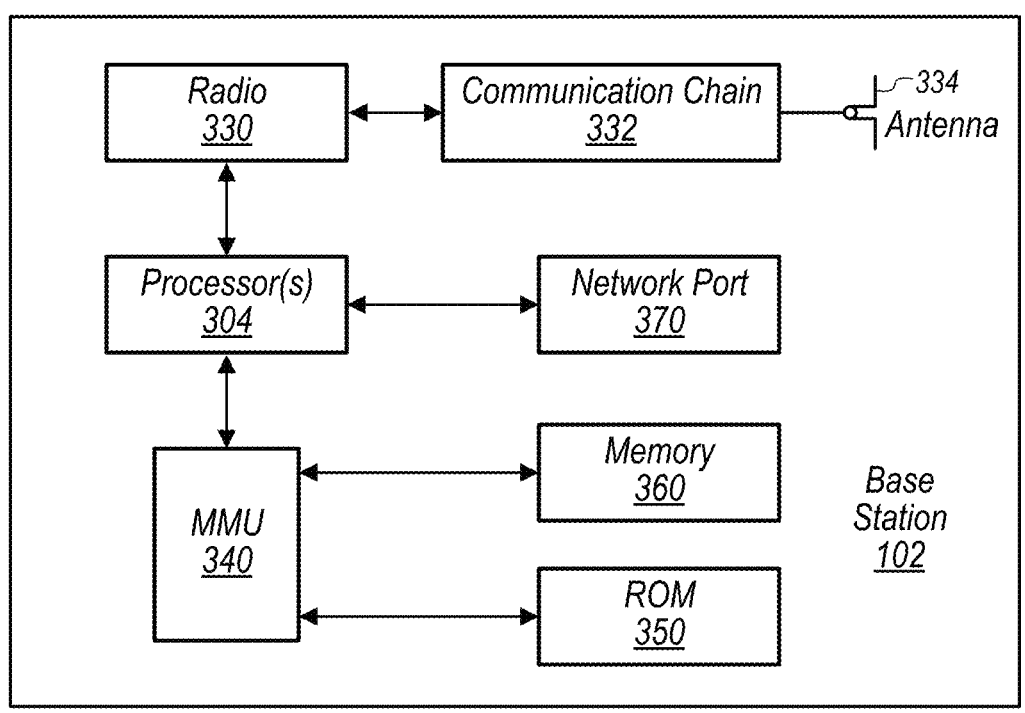
FIG. 3 is a block diagram illustrating an exemplary base station, according to some embodiments.

FIG. 3—Base Station

FIG. 3 illustrates an exemplary block diagram of a base station 102. In some embodiments, base station 102 may be a broadcast base station such as base station 102A of FIG. 2 and/or a cellular base station such as base station 102B of FIG. 2. It is noted that the base station of FIG. 3 is merely one example of a possible base station. As shown, the base station 102 may include processor(s) 304 which may execute program instructions for the base station 102. The processor(s) 304 may also be coupled to memory management unit (MMU) 340, which may be configured to receive addresses from the processor(s) 304 and translate those addresses to locations in memory (e.g., memory 360 and read-only memory (ROM) 350) or to other circuits or devices.

The base station 102 may include at least one network port 370. The network port 370 may be configured to couple to a telephone network and provide a plurality of devices, such as UE devices 106, access to the telephone network as described above. In some embodiments, the network port 370 (or an additional network port) may be coupled to a television network and configured to receive content for broadcasting. The network port 370 (or an additional network port) may also or alternatively be configured to couple to a cellular network, e.g., a core network of a cellular service provider. The core network may provide mobility related services and/or other services to a plurality of devices, such as UE devices 106. In some cases, the network port 370 may couple to a telephone network via the core network, and/or the core network may provide a telephone network (e.g., among other UE devices 106 serviced by the cellular service provider).

The base station 102 may include at least one antenna 334. The at least one antenna 334 may be configured to operate as a wireless transceiver and may be further configured to communicate with UE devices 106 via radio 330. The antenna 334 communicates with the radio 330 via communication chain 332 in the illustrated embodiment. Communication chain 332 may be a receive chain, a transmit chain or both. The radio 330 may be configured to communicate via various RATs.

The processor(s) 304 of the base station 102 may be configured to implement part or all of the methods described herein, e.g., by executing program instructions stored on a memory medium (e.g., a non-transitory computer-readable memory medium). Alternatively, the processor 304 may be configured as a programmable hardware element, such as an FPGA (Field Programmable Gate Array), or as an ASIC (Application Specific Integrated Circuit), or a combination thereof. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments, base station 102 is configured to perform both broadcast and bi-directional packet-switched communications. In these embodiments, base station 102 may include multiple radios 330, communication chains 332, and/or antennas 334, for example. In other embodiments, the disclosed spectrum sharing techniques may be performed by different base stations configured to perform only broadcast transmissions or only packet-switched communications.

Figure 4:
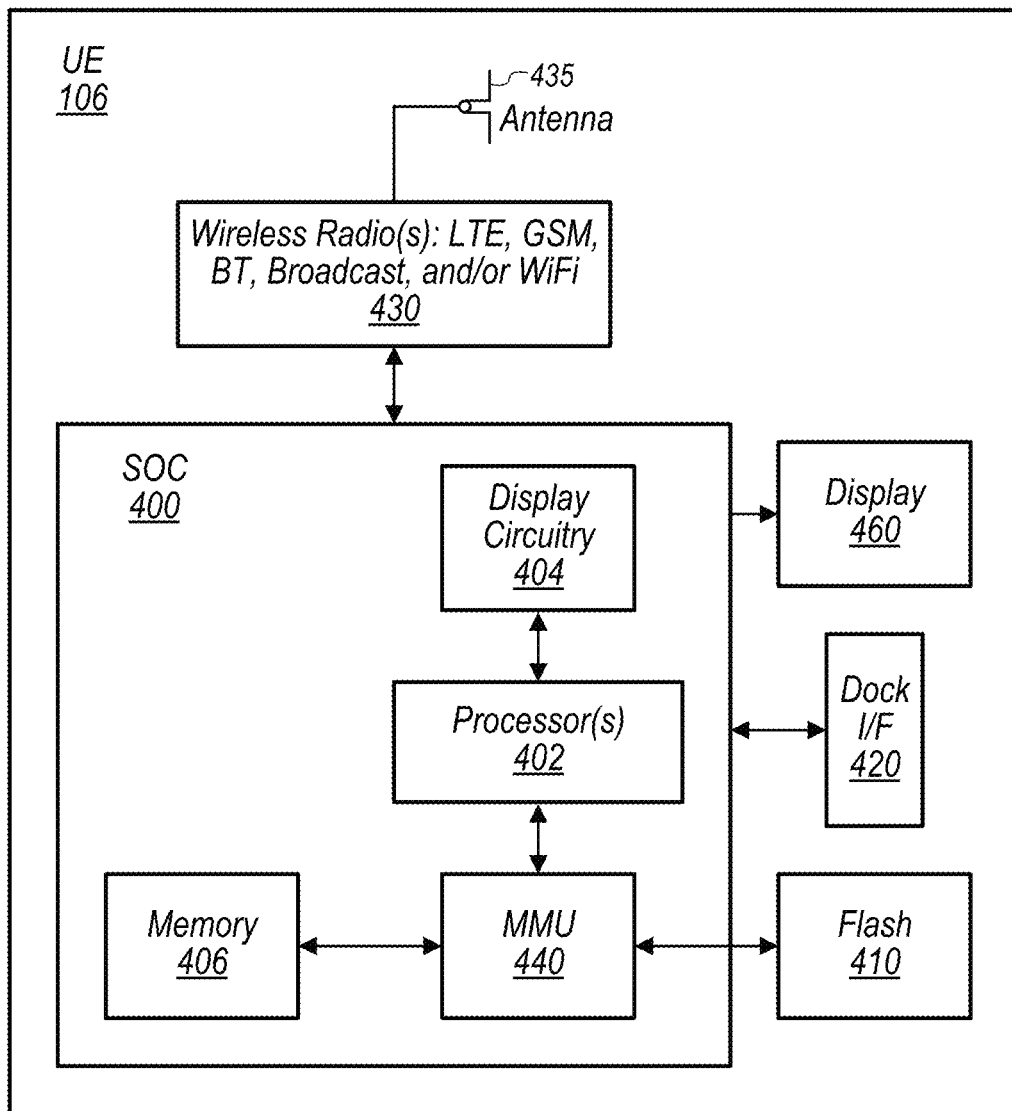
FIG. 4 is a block diagram illustrating an exemplary UE, according to some embodiments.

FIG. 4—User Equipment (UE)

FIG. 4 illustrates an example simplified block diagram of a UE 106. The UE 106 may be any of various devices as defined above. UE device 106 may include a housing which may be constructed from any of various materials.

As shown, the UE 106 may include a system on chip (SOC) 400, which may include portions for various purposes. The SOC 400 may be coupled to various other circuits of the UE 106. For example, the UE 106 may include various types of memory (e.g., including NAND flash 410), a connector interface 420 (e.g., for coupling to a computer system, dock, charging station, etc.), the display 460, wireless communication circuitry 430 such as for LTE, 5G New Radio (NR), GSM, Bluetooth (BT), WLAN, and/or broadcast, etc. The UE 106 may further comprise one or more smart cards that implement SIM (Subscriber Identity Module) functionality. The wireless communication circuitry 430 may couple to one or more antennas, such as antenna 435.

As shown, the SOC 400 may include processor(s) 402 which may execute program instructions for the UE 106 and display circuitry 404 which may perform graphics processing and provide display signals to the display 460. The processor(s) 402 may also be coupled to memory management unit (MMU) 440, which may be configured to receive addresses from the processor(s) 402 and translate those addresses to locations in memory (e.g., memory (e.g., read only memory (ROM) or another type of memory) 406, NAND flash memory 410) and/or to other circuits or devices, such as the display circuitry 404, wireless communication circuitry 430, connector I/F 420, and/or display 460. The MMU 440 may be configured to perform memory protection and page table translation or set up. In some embodiments, the MMU 440 may be included as a portion of the processor(s) 402. In some embodiments, the processor, MMU, and memory may be a distributed multiprocessor system. For example, the processor system may comprise a plurality of interspersed processors and memories, where processing elements (also called functional units) are each connected to a plurality of memories, also referred to as data memory routers. The processor system may be programmed to implement the methods described herein.

In some embodiments (not shown), UE 106 is configured to receive wireless broadcasts, e.g., from broadcast base station 102A of FIG. 2. In these embodiments, UE 106 may include a broadcast radio receiver. In some embodiments, UE 106 is configured to receive broadcast data and perform packet-switched cellular communications (e.g., LTE) at the same time using different frequency bands and/or the same frequency resources during different time slices. This may allow users to view TV broadcasts while performing other tasks such as browsing the internet (e.g., in a split-screen mode), using web applications, or listening to streaming audio. In other embodiments, the disclosed techniques may be used in systems with devices that are configured as broadcast receivers or for cellular communications, but not both.

The processor(s) 402 of the UE device 106 may be configured to implement part or all of the features described herein, e.g., by executing program instructions stored on a memory medium (e.g., a non-transitory computer-readable memory medium). In some embodiments, the processor(s) 402 may comprise a multiprocessor array of a plurality of parallelized processing elements. For example, the processor(s) 402 may be designed in accordance with the HyperX architecture described in detail in Reference 6, or another parallel processor architecture. In these embodiments, separate ones of the parallelized processing elements may be configured to perform decoding procedures on separate respective bit paths of a successive cancellation list (SCL) decoding procedure, or they may be configured to perform decoding procedures on separate encoded messages in parallel, for example. Alternatively (or in addition), processor(s) 402 may be configured as a programmable hardware element, such as an FPGA (Field Programmable Gate Array), or as an ASIC (Application Specific Integrated Circuit). Alternatively (or in addition) the processor(s) 402 of the UE device 106, in conjunction with one or more of the other components 400, 404, 406, 410, 420, 430, 435, 440, 460 may be configured to implement part or all of the features described herein.

UE 106 may have a display 460, which may be a touch screen that incorporates capacitive touch electrodes. Display 460 may be based on any of various display technologies. The housing of the UE 106 may contain or comprise openings for any of various elements, such as buttons, speaker ports, and other elements (not shown), such as microphone, data port, and possibly various types of buttons, e.g., volume buttons, ringer button, etc.

The UE 106 may support multiple radio access technologies (RATs). For example, UE 106 may be configured to communicate using any of various RATs such as two or more of Global System for Mobile Communications (GSM), Universal Mobile Telecommunications System (UMTS), Code Division Multiple Access (CDMA) (e.g., CDMA2000 1×RTT or other CDMA radio access technologies), Long Term Evolution (LTE), LTE Advanced (LTE-A), 5G NR, and/or other RATs. For example, the UE 106 may support at least two radio access technologies such as LTE and GSM. Various different or other RATs may be supported as desired.

In some embodiments, UE 106 is also configured to receive broadcast radio transmissions which may convey audio and/or video content. In still other embodiments, a UE 106 may be configured to receive broadcast radio transmissions and may not be configured to perform bi-directional communications with a base station (e.g., UE 106 may be a media playback device).

UE-Specific Control Messages

In current cellular communication systems, a base station may broadcast a plurality of control messages (e.g., downlink control information (DCI) messages, or other encoded control information) that are each intended for reception by a specific user equipment device (UE).

Figure 5:
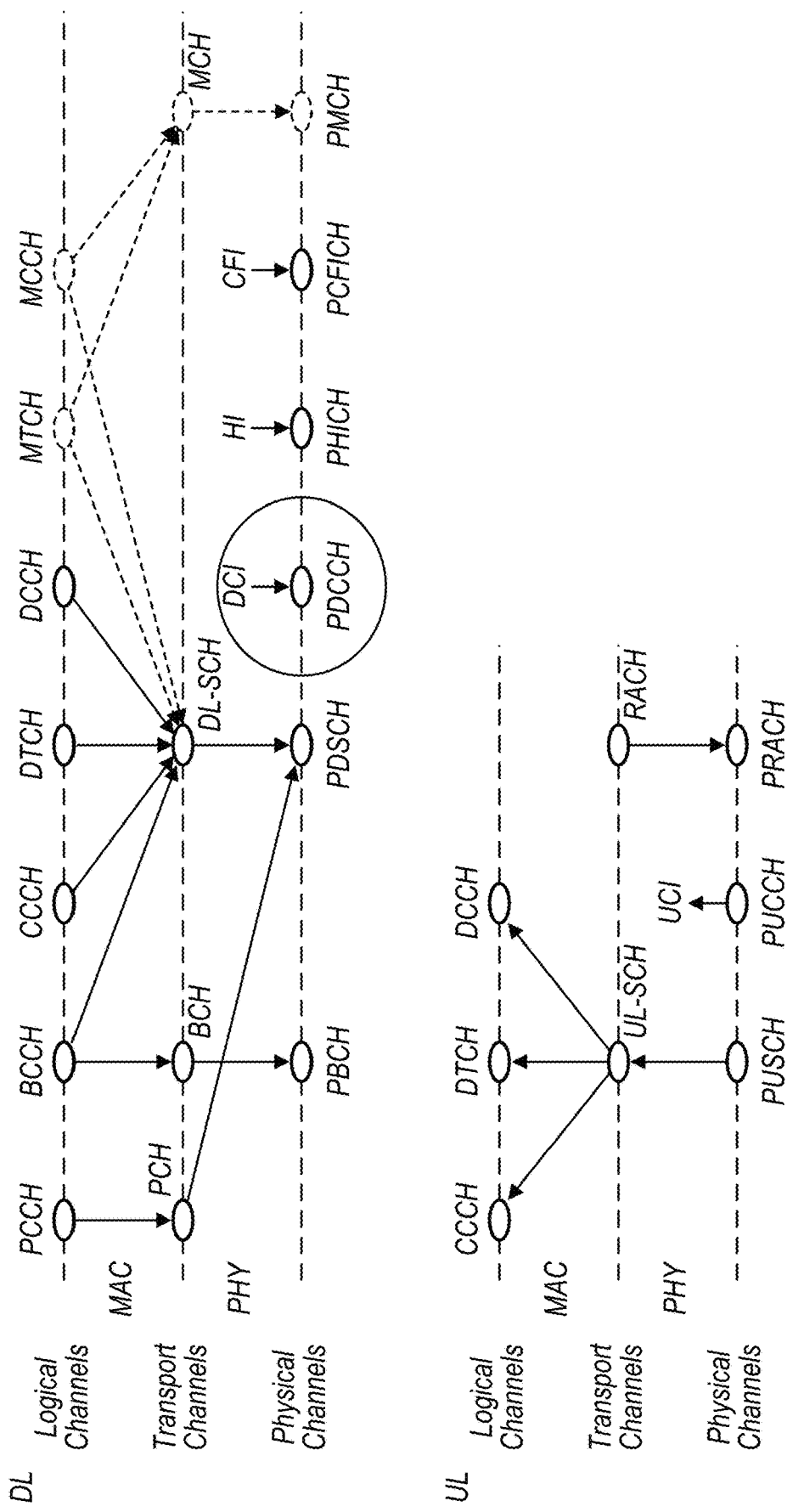
FIG. 5 is a schematic diagram of various communication channels used for uplink and downlink communication, according to some embodiments.

FIG. 5 is a schematic diagram of various channels in downlink (DL) and uplink (UL) that are currently in use in some cellular communication technology standards (e.g., in LTE). As illustrated, DCI messages may be included in the physical downlink control channel (PDCCH), which may comprise a shared search space servicing a plurality of UEs. Embodiments herein describe DCI messages that are typically sent over PDCCH. However, it may be appreciated by one of skill in the art how similar methods may be used in any of a variety of other communication channels (e.g., such as the other illustrated channels of FIG. 5), wherein a base station transmits UE-specific messages that may need to be disambiguated by a large number of serviced UEs (e.g., the physical broadcast channel, PBCH, may also be used to transmit this type of message, among other possibilities).

To ensure that the correct UE receives a particular message, in some embodiments, the base station may append a cyclic redundancy check (CRC) at the end of the control message. In some embodiments, the base station may scramble a CRC that is attached to certain downlink control information (DCI) messages according to a user equipment identifier (UE ID).

In these embodiments, if the wrong UE (e.g., a UE with a different UE ID than that used to scramble the CRC) attempts to descramble the CRC, it may result in a CRC error and the message may be dropped. Thus, only the UE with a matching UE ID may be able to correctly descramble the CRC and acknowledge the DCI message. If a UE receives a message in a resource block for which the CRC is unsuccessful, the UE may assume that the message is destined for another user and drop the message.

While appending a scrambled CRC to a control message may be an effective way to verify that the message is received by the correct UE, the method typically requires that the entire control message is decoded before the check can be performed. Embodiments described herein improve on this methodology by enabling early termination for a mismatched UE ID during the decoding process. Embodiments herein further improve on this methodology by mitigating inter-cell interference by scrambling a subset of the control message based on a CELL ID.

According to some embodiments, a proposed method leverages properties of polar codes whereby information known to the transmitter and receiver can be inserted in frozen bits and/or information bits to expedite ID verification. For example, a shortcoming of typical CRC methods is that the UE cannot verify the CRC until after the entire message has been decoded. By leveraging properties of polar codes, embodiments described herein allow a UE to determine whether a message was intended for the UE before the decoding process is completed. If it is determined that the message is not intended for the UE, the UE may undergo "early termination", and abandon (or abort) the decoding process.

Early termination with PC (parity-check) polar codes may be derived from the potential to place a known, agreed (between an assigned transmitter/receiver (TX/RX) pair) pattern in frozen bits, starting after the first information bit (e.g., starting after puncturing). The encoder (transmitter) may insert a bit field containing a unique pattern known both to TX and RX. For example, the transmitter may modulate a subset of the frozen bits and/or information bits with an identifier bit field (alternatively called "check bits"). Throughout this disclosure, modulating a first set of bits with a second set of bits may be understood to correspond to performing an exclusive-OR (XOR) operation between the bits in the same relative positions within each of the two sets of bits. The bit field may be interrogated at the RX by some means, (e.g. path metric reliability, log likelihood ratio (LLR) growth, hard decision decoding, or another metric) to determine whether the current RX is the intended recipient of the packet in question.

The receiver may otherwise use the known bit values just as it would a field of all zeros in decoding the surrounding information bits. Decoding may cease if a match to the intended recipient is not found using one of the methods described above. In other words, given the successive nature of polar decoding, the RX need not decode the entire packet to determine whether the check bits match its assigned ID.

Different criteria may be used to determine where to place the identifier bit field among the frozen bits, according to various embodiments. One possibility is to place the identifier bit field in frozen bits following the first information bit, as complexity can be significantly reduced if the decoder is able to bypass the first several frozen bits on the presumption that they are all zero. Additionally, it may be determined how many bits should be assigned to the check bits. The more bits assigned, the more reliable the detectability may become, but the longer the decoder may remain active before it can terminate. Additionally, it may be determined how deep into the block to insert the identifier bit field, based on increasing channel reliability with bit index. The depth of placement may be decided jointly with how many check bits to employ. The deeper into the block, the more reliable the underlying check bits, however, the longer the decoder may run before early termination can be determined.

Figure 6:
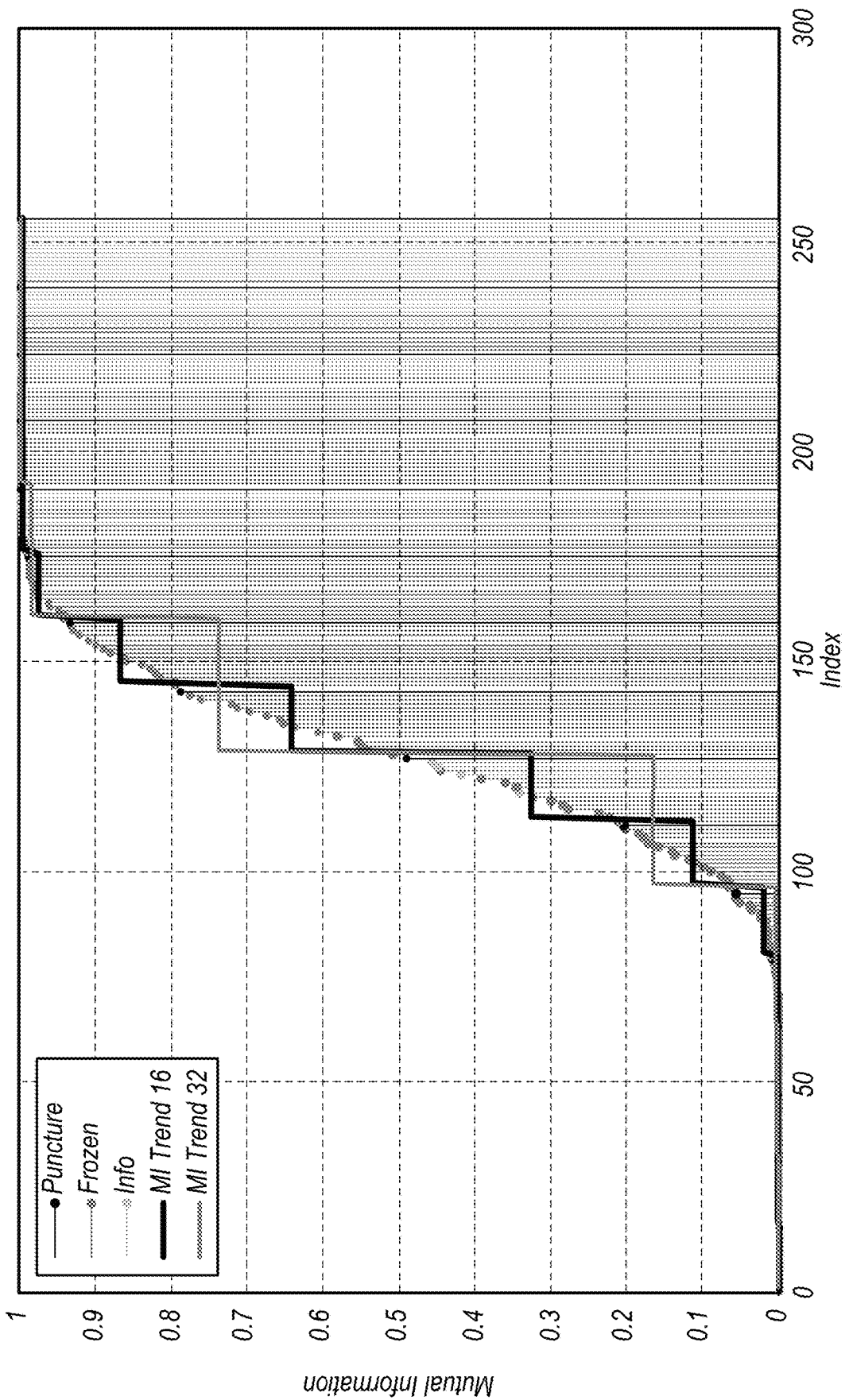
FIG. 6 is a graph of mutual information of bits in a polar code as a function of bit index, according to some embodiments.

For example, FIG. 6 illustrates the mutual information as a function of bit index for a particular implementation of polar codes. As illustrated, the later bit indices contain a larger amount of mutual information (e.g., they are more reliable), but additional latency is incurred if the identifier is inserted later in the polar code. The point of puncturing is illustrated by the thin black vertical lines, while frozen bits and information bits are illustrated as thin dark grey and light grey vertical lines, respectively. The mutual information (MI) trend 16 (thick black solid line) illustrates the mutual information obtained when averaging over 16 bits at a time, and the MI trend 32 (thick grey solid line) illustrates the mutual information obtained when averaging over 32 bits at a time.

In some embodiments, the modulated frozen bits may be selected such that they occur within the control information after an information bit with a predetermined threshold level of reliability. In some embodiments, the modulated frozen bits are selected to balance a reliability and a latency associated with decoding of the encoded modulated control information by a UE.

Alternatively, in some embodiments, a pseudorandom sequence generated from the UE ID may be used to modulate the frozen bits to help a receiver discern blocks meant for it versus those destined for another user. Advantageously, this may be done without affecting the code rate, user throughput or decoding reliability. Given the limited extent of the UE ID relative to the typical number of available frozen bits, the method may use a scrambling 'mask' with a pseudorandom bit sequence that matches the extent of the frozen bit field, wherein the pseudorandom bit sequence is based on the UE ID. In other words, the transmitter may generate a pseudorandom sequence of bits based on the UE ID, wherein the pseudorandom sequence of bits is the same length as the frozen bit field. The transmitter may then modulate all of the frozen bits with the pseudorandom sequence of bits.

In current cellular communication systems (e.g., LTE, and potentially NR), a base station (i.e. eNodeB or eNB) may multiplex DCIs for multiple UEs in a set of predefined candidate locations. This places a particular burden on the UE which, employing a blind detection procedure, may interrogate each candidate location to identify the DCIs intended for it versus those meant for other users. Blind detection is typically used in downlink communications, because a base station often services a large number of UEs, and may be unable to dedicate specific radio resources to each of the serviced UEs. Rather, the base station may transmit UE-specific information (such as DCI, or other downlink control information) in a shared set of candidate locations, and each UE may perform blind detection on the candidate locations to determine if a particular message was intended for it.

Embodiments herein expedite the blind detection procedure, as the base station may scramble the frozen bits of a polar code with a UE-specific mask to facilitate user identification. In some embodiments, the information bits of the DCI may additionally be scrambled according to a cell-specific mask to mitigate adjacent cell interference.

While embodiments herein may be described in reference to a base station in communication with a UE device, it can be readily understood that the methods described may be generally applied to many different kinds of transmitters and receivers. In particular, any transmitter/receiver pair may benefit from implementation of embodiments described herein, if the transmitter is attempting to transmit communications to a particular receiver, wherein there is a need for the receiver to verify both or either of: a) the identification of the transmitter and/or b) that the transmission was intended for the particular receiver.

Embodiments herein describe a scrambling sequence design that builds on the objectives set forth by LTE and, leveraging attributes unique to polar codes, extends the design capabilities to include multi-mode block discrimination with the potential for early termination in a unified framework. In some embodiments, separate masks are assigned to respective portions of the polar code construction, each with a distinct purpose: UE identification, early termination of blind decoding to minimize energy expended on blocks not intended for the present user, and/or adjacent cell interference mitigation. Early termination of blind decoding may advantageously reduce overall energy consumption for mobile devices.

In some embodiments, methods are presented that retain the CRC scrambling used by LTE. In some embodiments, a UE-specific pseudo-random sequence (e.g., a pseudo-random binary sequence or another type of pseudo-random sequence, as described in further detail below) inserted in the polar code frozen bit-field enables early termination. These embodiments may improve on previous implementations, wherein the entire message has to be decoded before the CRC may be performed. Given superior cross-correlation properties, the pseudo-random sequence (PRS) may provide improved code separation beyond that afforded by CRC scrambling alone.

In some embodiments a second PRS mask, derived from the CELL ID, is applied to the information bit field affording cell separation analogous to that available with LTE. In some embodiments, each of the first and second PRS masks may be applied together as an ensemble in a unified discrimination mask that simultaneously enables user identification with early termination as well as adjacent cell interference mitigation.

Figure 7:
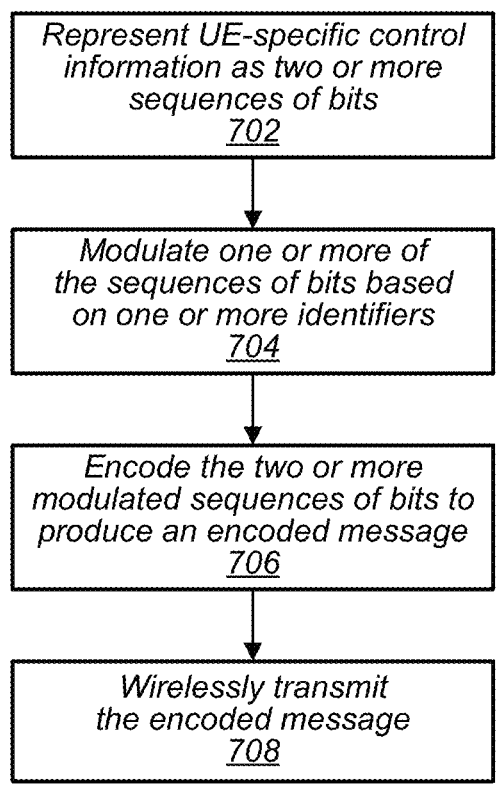
FIG. 7 is a flow diagram illustrating an exemplary method for a transmitter to encode a message that has been modulated based on one or more identifiers, according to some embodiments.

FIG. 7—Modulating and Encoding Control Information

FIG. 7 illustrates a flow chart diagram for a method for modulating and encoding a message by a transmitter, according to some embodiments. In some embodiments, separate scrambling masks may be applied to each of a plurality of different blocks within an encoded message. Each of the separate scrambling masks may serve to verify by the receiver an identity of either the transmitter or the receiver. For example, and as described in greater detail below, both the transmitter and the receiver may be preconfigured with knowledge of the transmitter and/or receiver identities, such that the receiver may be able to selectively demask respective blocks of the scrambled message. In some embodiments, the transmitter may be a base station and the receiver may be a user equipment device (UE). Alternatively, both the transmitter and receiver may be UEs.

In some embodiments, a transmitter may employ a polar coding scheme to encode a message that is intended for a specific receiver. In some embodiments, the encoded message may be a downlink control information (DCI) message, although other types of control messages, and in general any type of transmitted message may be used according to embodiments described herein. While embodiments herein may be described in terms of DCI messages, it may be appreciated by those of skill in the art that the described embodiments may be generalized to other types of transmitted control messages and other types of messages (e.g., payload messages).

Polar coding, as described in greater detail below, divides (or 'polarizes') a plurality of communication channels into more reliable and less reliable channels. The more reliable channels are often used to carry the payload information of the communication, and these bits of the communication are often referred to as 'information bits'. In some embodiments, the transmitter may append a sequence of cyclic redundancy check (CRC) bits at the end of the information bits. The less reliable channels typically contain reference bits that are known to both the transmitter and the receiver, commonly referred to as 'frozen bits'. The frozen bits may be utilized by the receiver to facilitate the decoding process.

While embodiments herein are described in terms of polar codes, it may be appreciated that the methods described may also be applied to various other coding schemes. For example, embodiments herein may be applied to other types of forward error correction (FEC) codes, and more generally to any type of encoded message.

At 702, the transmitter may represent UE-specific control information as two or more sequences of bits. In various embodiments, the two or more sequences of bits may be contiguous, non-contiguous, or may partially overlap. In some embodiments, the transmitter may be configured to encode messages using polar codes, and the two or more sequences of bits may include frozen bits, information bits, and/or cyclic redundancy check (CRC) bits.

At 704, the transmitter may modulate one or more of the sequences of bits based on one or more identifiers. In some embodiments, the one or more identifiers may identify the transmitter (e.g., CELL ID or base station ID) and/or the receiver (e.g., UE ID). In some embodiments, a pseudorandom sequence (PRS) may be derived from the identifier(s), and the identifier(s) may be known to both the transmitter and receiver. As described in further detail below, each of the one or more identifiers may be used to generate a respective pseudorandom sequence that is generated to be the same length as the respective subset of encoded bits for which the pseudorandom sequence will be applied as a scrambling mask.

In some embodiments, modulating the one or more of the sequences of bits based on the one or more identifiers may involve applying separate scrambling 'masks' to modulate the sequences of bits based on the identifier(s). The application of a scrambling mask may involve modulating each sequence of bits with a PRS of bits generated from a respective identifier. For example, a UE ID corresponding to the intended receiver may be used to generate a first pseudorandom sequence PRS that is the same length as the length of a frozen bit sequence in a polar code. The first PRS may be used to modulate the frozen bits of the polar code. In other embodiments, the first PRS may be the same length as a subset of frozen bits, and may be used to modulate only the subset of frozen bits. Alternatively, a subset of the frozen bits may be directly modulated by the UE ID.

In the case where only a subset of the frozen bits is modulated based on the UE ID (or the PRS generated from the UE ID), the subset of frozen bits to be modulated may be selected such that those frozen bits occur within the control information after an information bit with a predetermined threshold level of reliability. For example, later bits in polar coding are more reliable, and the modulated subset of frozen bits may be selected such that the subset of bits occurs late enough to have a predetermined threshold level of reliability. Selecting a subset of frozen bits for modulation that occurs later in the control information also introduces additional latency into the decoding procedure. In some embodiments, the subset of frozen bits may be selected to balance a reliability and a latency associated with decoding of the encoded modulated control information by a UE.

The UE ID, or the PRS generated based on the UE ID, may be used to modulate the frozen bits while not modulating the information bits. In other words, the UE ID may be used to selectively modulate only the frozen bits, and not the information bits, of the control information.

Alternatively or in addition, a CELL ID of the transmitter may be used to generate a second PRS that is the same length as the length of the information bit sequence of a polar code. The second PRS may be used to modulate the information bits of the polar code. Advantageously, modulating the information bit sequence based on the pseudorandom sequence generated from the base station identifier may mitigate adjacent cell interference experienced by UEs that receive the encoded modulated control information. For example, a first UE may be located in a service area of two or more base stations, and a UE ID used for the first UE by a first base station (e.g., a base station upon which the first UE is camped) may additionally be used as a UE ID for another (second) UE by a second base station (e.g., a base station upon which the first UE may receive broadcast messages but is not camped). In this case, the first UE may mistake a message intended for the second UE as intended for the first UE (e.g., because the same UE ID is used for both). In the example, modulating the information bit sequence based on a base station identifier may allow the first UE to determine whether a particular message has originated from the correct base station (e.g., the base station upon which the first UE is camped).

Alternatively or in addition, a UE ID corresponding to the intended receiver may be used to generate a third PRS that is the same length as the CRC bits that are appended to a polar coded message. The third PRS may be used to modulate the CRC mask, such that the CRC mask is generated based on the UE ID. For example, the information bits may be appended with a cyclic redundancy check (CRC) scrambled with a CRC mask based on the UE ID, which may be performed prior to modulating the information bits. This may offer an additional check by the receiver that the receiver is the intended recipient of the message.

At 706, the two or more sequences of bits may be encoded to produce an encoded message. For example, the modulated frozen bits, information bits, and/or CRC bits may be encoded using polar codes to produce encoded modulated control information, which may comprise the encoded message. The encoded modulated control information may be transmitted to one or more UEs for performing downlink control information (DCI) blind detection.

At 708, the transmitter may transmit the encoded message to the receiver (e.g., in a wireless manner). The transmission may occur using any of a variety of wireless communication technologies, as described variously in the present disclosure.

Figure 8:
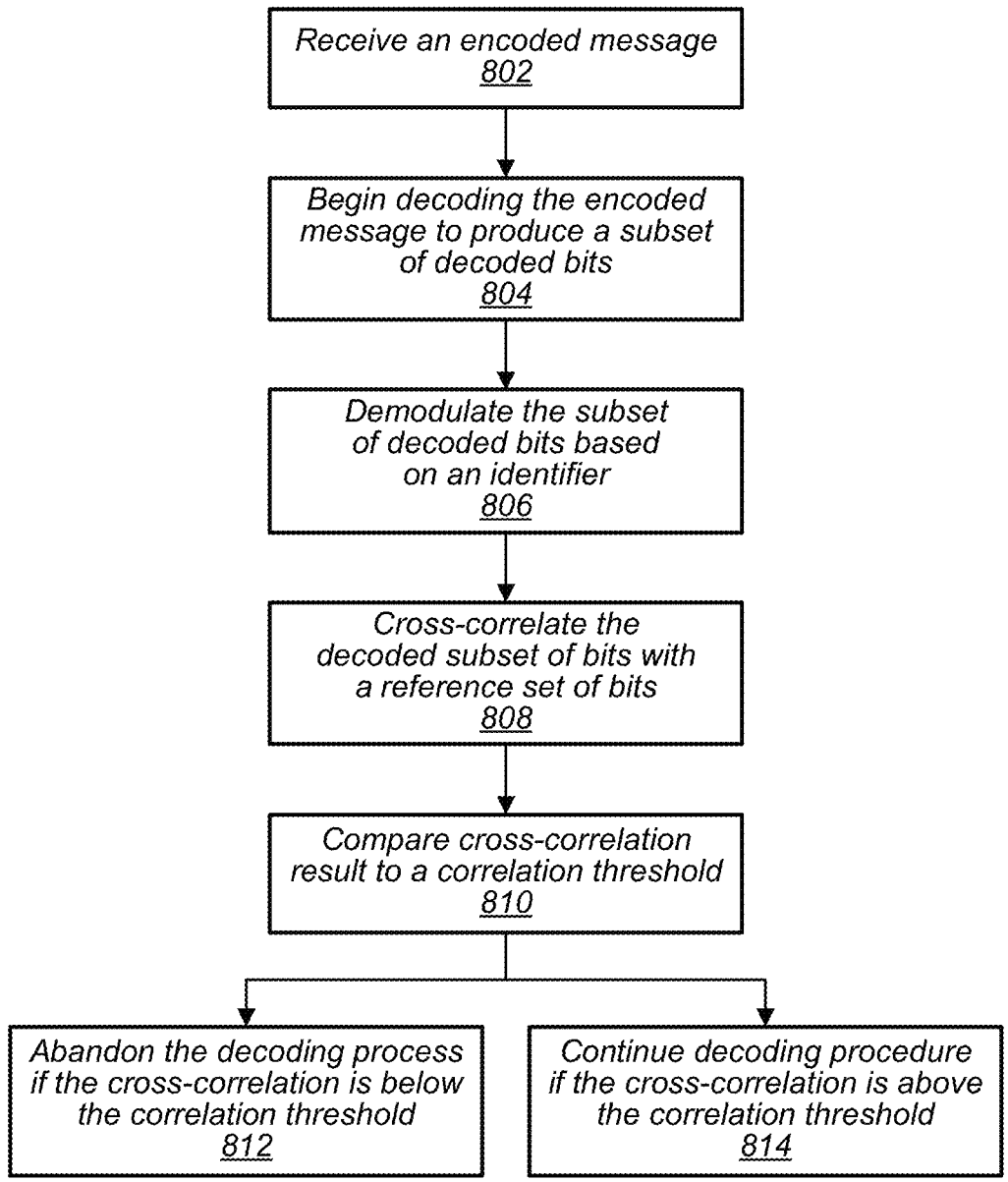
FIG. 8 is a flow diagram illustrating an exemplary method for decoding an encoded message, and demodulating the decoded bits based on an identifier, according to some embodiments.

FIG. 8—Decoding and Demodulating an Encoded Message

FIG. 8 is a flow chart diagram illustrating a method for decoding and demodulating an encoded message (e.g., coded data, or polar coded data received from a remote transmitter) by a receiver, according to some embodiments. The receiver may be a user equipment device (UE) comprising a radio, a non-transitory computer-readable memory medium, and a processor (e.g., as described above in reference to FIG. 4), or it may be another kind of receiver.

At 802, the receiver may receive the encoded message from a transmitter in a wireless manner. The encoded message may comprise coded data including an encoding of one or more sequences of bits (e.g., a first sequence of bits and potentially a second and third sequence of bits). The receiver may have knowledge of each of the identifiers used by the transmitter to modulate respective subsets of bits of the encoded message. The encoded message may be a polar coded message, and the one or more sequences of bits may include a sequence of frozen bits, a sequence of information bits, and/or a sequence of cyclic redundancy check (CRC) bits. The encoded message may be received and decoded (e.g., as described in detail below) as part of a downlink control information (DCI) blind detection procedure.

The receiver may proceed to implement a decoding procedure on the coded data, as described in further detail below in reference to steps 804-814. The decoding procedure may be a successive cancellation list decoding procedure, or any of a variety of other decoding procedures.

At 804, the receiver may begin a decode of the encoded message to produce a subset of the first sequence of bits. The first sequence of bits may be frozen bits of a polar code, so that the decoding procedure begins by decoding a subset of the frozen bits, for example.

The decoded subset of bits may be used (e.g., as described in more detail below in reference to steps 806-810) to verify whether the encoded message was intended for the receiver. In some embodiments, the particular subset of bits that is used in this subsequent ID verification may be selected to balance a reliability and a latency associated with the decoding procedure. For example, in embodiments wherein the encoded message is a polar coded message and the first sequence of bits are frozen bits of the polar code, frozen bits that occur later in the decoded message may have a higher reliability than earlier frozen bits, but these later frozen bits will not be decoded until later in the decoding process. The particular subset of frozen bits used for ID verification may be selected to balance the desirable increase in reliability with the undesirable increase in latency associated with later occurring frozen bits of the decoded message.

At 806, the receiver may demodulate the decoded subset of the first sequence of bits with a first pseudorandom sequence (PRS) generated from a first identifier. For example, the receiver may be a UE that may use a first PRS generated from the UE's ID to demodulate the decoded subset of frozen bits of a polar coded message. The receiver may generate the first PRS, which may be the same PRS that was previously generated by the transmitter. In these embodiments, the transmitter may have previously scrambled the frozen bits using the same PRS, such that the receiver may unscramble the scrambling mask by demodulating the decoded subset of frozen bits based on the PRS. The PRS may be the same length as the entire frozen bit field, but the demodulation may be performed using the subset of the PRS that corresponds to the decoded subset of frozen bits.

At 808, the receiver may perform a cross-correlation calculation between the subset of bits that have been decoded and a respective sequence of reference bits. For example, the transmitter and the receiver may be preconfigured to know which values the demodulated frozen bits should have (e.g., the frozen bits may be known by the transmitter and receiver to be a string of zeros or another sequence of values), and these values may be stored as a sequence of reference bits on a memory of the receiver. In these embodiments, a strong cross-correlation between the decoded frozen bits and the respective sequence of reference bits may indicate to the receiver that the demodulation of the frozen bits was performed with the correct UE ID. In some embodiments, the cross-correlation calculation may involve calculating a divergence of path metrics associated with the subset of decoded frozen bits and the corresponding subset of reference bits.

In some embodiments, the cross-correlation may be performed after demodulating using the PRS, but in other embodiments the sequence of reference bits may be based on the first identifier, and the demodulation step 806 may be skipped. In other words, rather than demodulating the decoded subset of bits based on the first identifier (or based on a PRS generated from the first identifier), the cross-correlation may be performed with reference bits that are generated based on the first identifier, so that the demodulation is implicitly accomplished through the cross-correlation calculation. The PRS may be the same length as the entire frozen bit field, but the demodulation may be performed using the subset of the PRS that corresponds to the decoded subset of frozen bits.

At 810, the receiver may compare the result of the cross-correlation calculation to a correlation threshold. The correlation threshold may be a predetermined degree of correlation, which may or may not vary depending on the number of bits used in the cross-correlation calculation.

At 812, if the result of the cross-correlation calculation is below the predetermined correlation threshold, the receiver may determine that the demasking procedure was unsuccessful (e.g., because the message was intended for a different receiver with a different UE ID), and the receiver may abort the decoding procedure. In some embodiments, and as described in further detail below, the receiver may maintain a running average calculation of the cross-correlation as more frozen bits are decoded, and the receiver may continue the decoding procedure unless the results of the cross-correlation calculation fall below the predetermined correlation threshold. In some embodiments, after aborting the decoding procedure, the receiver may receive a second encoded message (e.g., it may receive a second polar coded message in a wireless manner from a base station), and the receiver may implement the decoding procedure (e.g., repeating steps 804-810) on the second polar coded message.

At 814, if the result of the cross-correlation calculation is above the predetermined correlation threshold, the receiver may continue the decoding procedure. For example, it may complete the decoding of the first sequence of bits (e.g., the frozen bits) and/or continue to decode the second sequence of bits (e.g., the information bits).

After decoding the second sequence of bits, the receiver may demodulate the second sequence of bits with a second pseudorandom sequence generated from a second identifier. For example, in the case where the second sequence of bits are information bits of a polar code, the information bits may have been scrambled using a second PRS generated from an identifier unique to the transmitter (e.g., a base station ID). In these embodiments, the receiver may demodulate (e.g., unscramble) the decoded information bits using the same second PRS. The receiver may then store the demodulated second sequence of bits as a decoded message in the memory medium.

When the receiver has finished decoding and demodulating the second sequence of bits (e.g., the information bits), the receiver may perform a cyclic redundancy check (CRC) to determine if an error has occurred during the decoding process. In some embodiments, the cyclic redundancy check may be performed using CRC bits that are appended at the end of the information bits. The CRC bits may have been scrambled using a PRS derived from an identifier that is unique to the intended receiver (e.g., its UE ID), and the receiver may unscramble the CRC bits using a third PRS generated from the receiver identifier. Alternatively, the CRC bits may have been scrambled directly with the identifier that is unique to the intended receiver (e.g., its UE ID), and the receiver may unscramble the CRC bits using the receiver identifier. In these embodiments, multiple layers of identity verification may be employed to mitigate intercell interference and ensure that the receiver receives the intended message. For example, if either of the UE ID or the CELL ID used by the receiver to generate respective PRSs is different from the UE ID or CELL ID used by the transmitter to modulate the message, the cyclic redundancy check may result in an error and the message may be dropped. If the CRC indicates that an error has occurred, the receiver may determine that the message may have been received from a transmitter with an identifier different from the transmitter identifier used by the receiver. The receiver may then abandon the message and monitor another channel or network resource (e.g., a different control element) to perform blind decoding on a subsequent message.

Explaining this process in further detail, upon receipt of a block whose check bits match that to which the UE is assigned, metrics internal to the decoder will accumulate coherently when using check bit values in place of the corresponding frozen bits. If instead the check bits do not match the values the decoder has determined to use in place of the frozen bits corresponding to the check bits, the metrics will not grow as expected. Based on this observation, this decode instance can be terminated as it presumably does not coincide with the intended DCI encoding.

In some embodiments, the receiver may be configured with a plurality of parallelized processors (e.g., the HyperX architecture described in Reference 6, or another parallel processor architecture), and each of the parallel processors may be configured to simultaneously perform one or more of steps 804-808 on separate received encoded messages. The parallel processors may dynamically reallocate computational resources as separate received encoded messages become decoded and/or abandoned. The receiver may receive multiple encoded messages, and separate ones of the parallelized processing elements may implement decoding procedures on each of the received one or more additional encoded messages. Alternatively, or in addition, separate ones of the parallelized processors may be configured to assist in decoding a single encoded message, to decrease decoding time. In some embodiments, and as described in further detail below, the decoding procedure may be a successive cancellation list (SCL) decoding procedure; and separate ones of the plurality of parallelized processors may be configured to perform decoding procedures on separate respective bit paths of the SCL decoding procedure.

If a particular encoded message is determined by a particular processor to not be intended for the receiver (e.g., if receiver determines to abort the decoding procedure at 810), the processor may be redirected to initiate a decoding procedure on another (second) received encoded message. Conversely, if a particular processor is successful in decoding a received message, the plurality of parallelized processors may abandon their respective decoding procedures and enter a low-power state or dormant state.

Multiple decoder instances may be enabled in parallel to reduce detection latency at the expense of added power consumption. In the general case, each decoder may run to completion before determining which among the active decoders has identified a valid decoding (e.g., based on a CRC check). Control block processing and data payload processing may have different latency and throughput requirements. The implemented degree of parallelization may be separately adjusted depending on the current workload, to obtain a desirable balance of latency and throughput for the current application. For example, the degree of parallelization (e.g., the number of concurrently active parallel processors) may be different during the decoding of control information (e.g., steps 804-810) than during subsequent or previous processing of payload data.

Early termination has potential to mitigate the added power consumption by halting certain decode instances based on the coherence of the check bits encountered in the course of decoding the block. Additionally, because the computational complexity per decoded bit may increase over time in a successive cancellation list decoder (e.g., because the number of paths being simultaneously decoded increases with the bifurcation of the bit paths), early termination may decrease computation time at a rate that is faster than linear in the terminated bit position. For example, terminating a decoding process after half of the bits have been decoded may shorten the decode time by more than half relative to a complete decode, because the second half of the bits may take longer to decode than the first half. This effect is illustrated schematically in FIG. 9. As illustrated, increased parallelization simultaneously leads to increased power consumption and decreased latency from the increased number of active processing elements (solid thick curved arrow). However, implementing early termination enables a larger reduction in latency given a similar increase in power consumption (dashed curved arrow).

Figure 9:
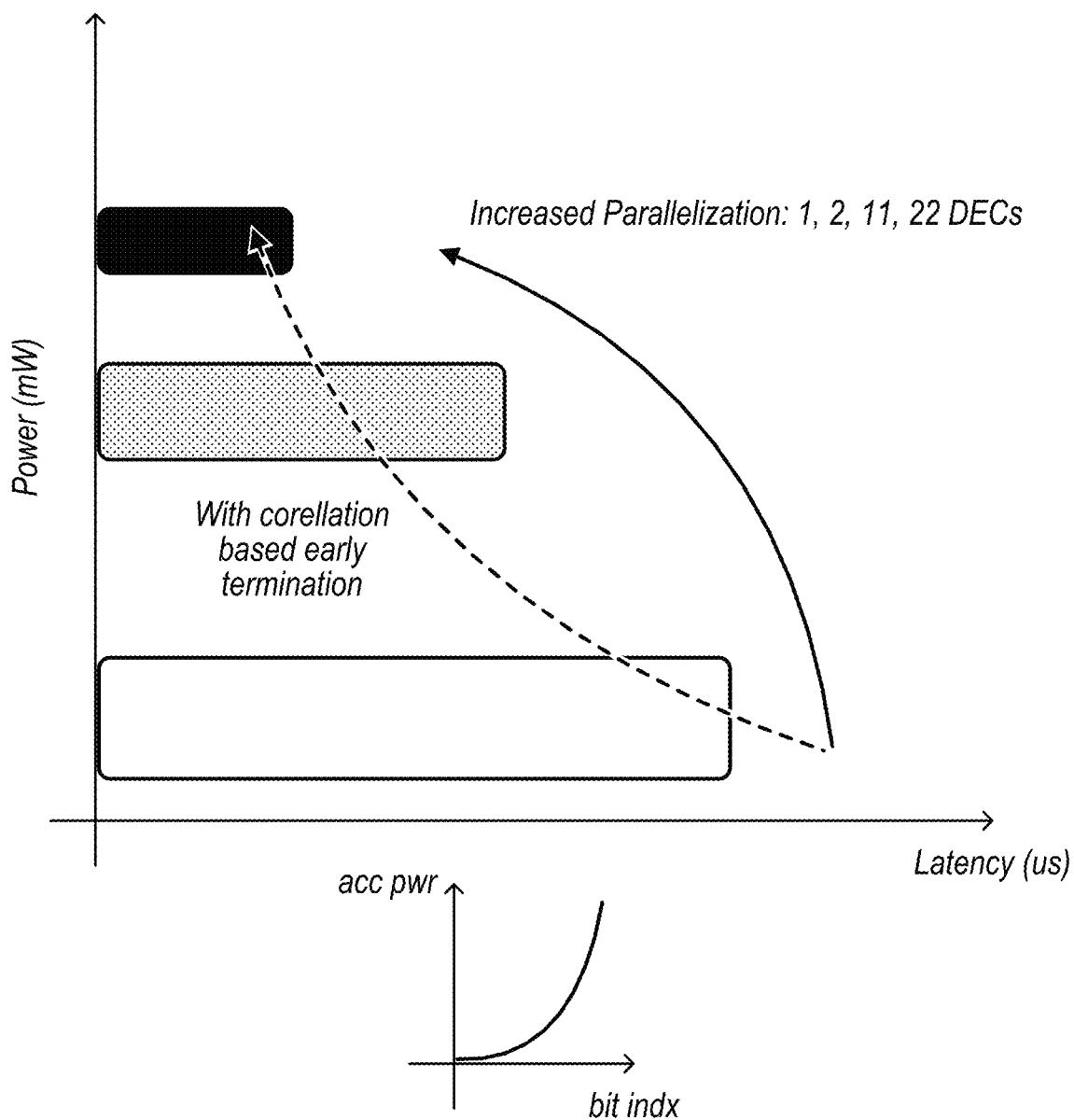
FIG. 9 is a graph of the tradeoff between latency and power consumption for parallelized processing, according to some embodiments.
Figure 10:
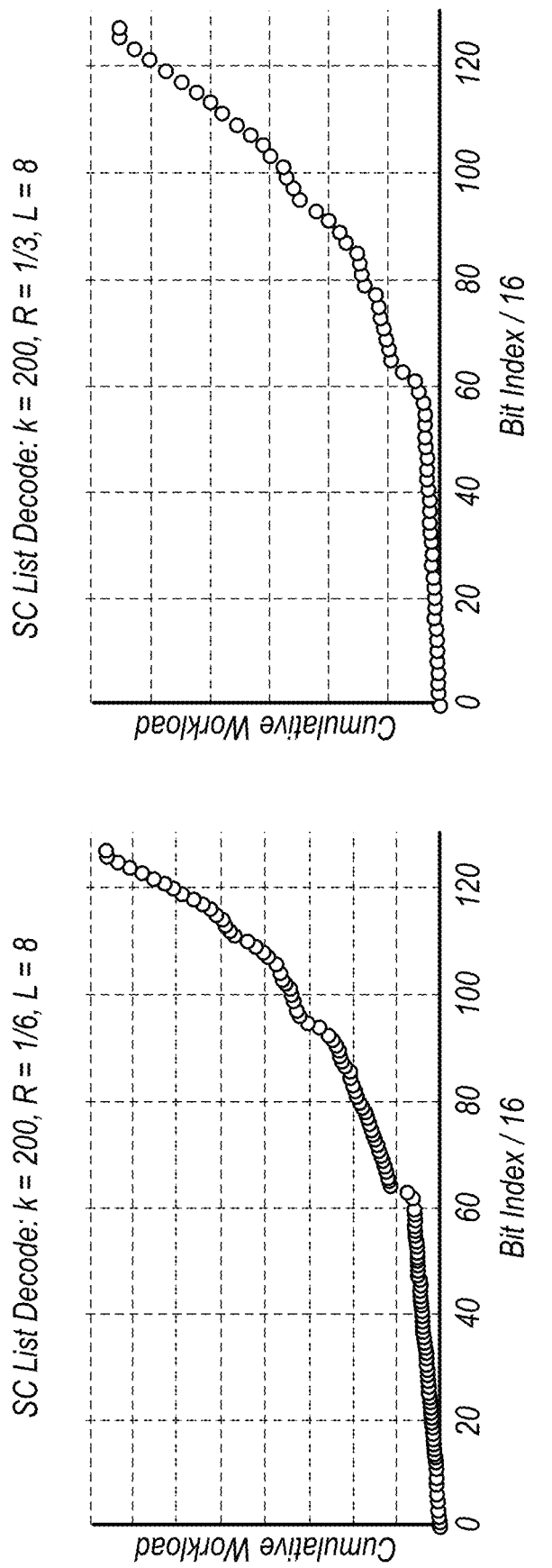
FIG. 10 shows two data plots of cumulative workload for successive cancellation list decoding as a function of bit index, according to some embodiments.

The lower diagram of FIG. 9 additionally illustrates schematically how the processing power requirements for decoding polar coded bits increase with the bit index. This effect is illustrated in more detail in FIG. 10, which uses actual data from two implementations of a successive cancellation list (SCL) decoder (described in further detail below). As illustrated, the cumulative work associated with the SCL decoder accelerates as a function of the bit index, for a code rate of R=1/6 (left graph) and R=1/3 (right graph).

Polar Codes

Figure 11:
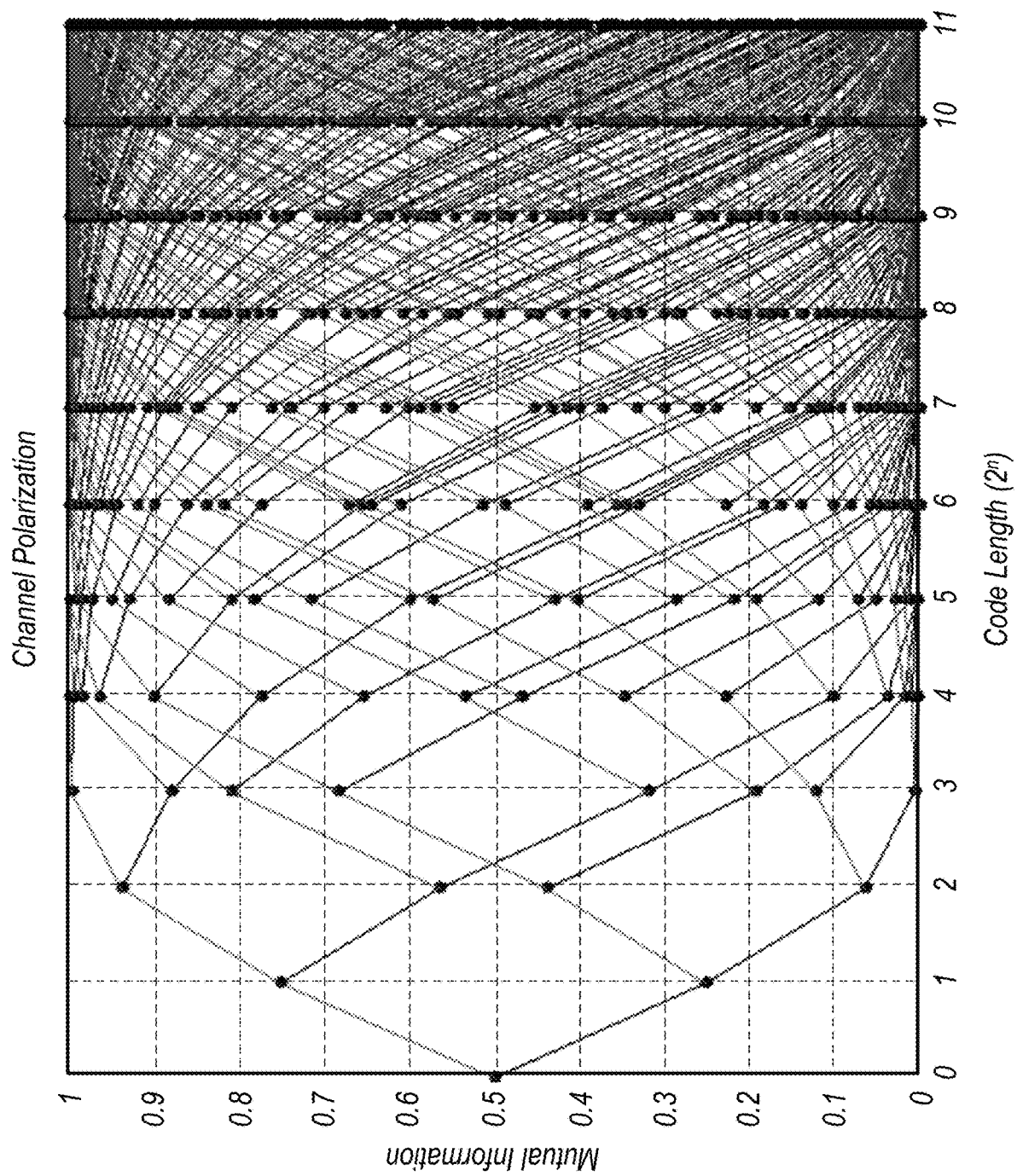
FIG. 11 illustrates an example of channel polarization, where n=11.

This section describes in further detail the function and structure of polar codes, according to various embodiments. A method of constructing capacity achieving codes for the memoryless binary symmetric channel is known in the art. The resulting polar codes leverage a phenomenon known as channel polarization (see FIG. 11) resulting from a recursive process by which the channel capacity, i.e. maximum mutual information, tends toward 1 (fully available) or 0 (unavailable). The corresponding bit probabilities, 1 and 0.5, respectively, approach their limits as the code length, $N=2^n$, increases with positive integer values n. Data may be transferred by placing information on bits on the most reliable channels (these bits may be referred to as information bits) while bits placed on the least reliable channels may be set to a fixed value, e.g. 0 or another known value or set of values. These bits may be referred to as frozen bits. Frozen bits and their mapping to the code matrix may be known by both the transmitter and receiver. As a result, frozen bits may be used as a reference by a decoding algorithm to determine whether an error has occurred from noise in the communication channel, or otherwise. For example, the known values of the frozen bits may be compared to the values determined through the decoding algorithm, to determine whether an error has occurred.

Successive Cancellation Algorithm

The successive cancellation (SC) decoder has been used to demonstrate the viability of the polar coding method. While offering low complexity decoding, the decoder requires long block sizes, approaching a million (i.e. $2^{20}$) bits, in order to compete with rival Turbo or Low Density Parity Check (LDPC) Codes. The successive nature of the SC decoder additionally imposes significant limitations on decoder throughput. However, as may be appreciated by one of skill in the art, any of the decoding processes described herein may be implemented according to a SC decoding methodology.

Successive Cancellation List Algorithm

An improved method for decoding polar codes has been established, which is called Successive Cancellation List (SCL) decoding. SCL decoding inspects two possibilities at each decoder phase in parallel: $\hat{u}_\varphi=0$ and $\hat{u}_\varphi=1$ for each non-frozen bit. The decoder may pursue multiple paths in parallel, retaining the most likely paths at each stage. The encoder may also append a cyclic redundancy check (CRC) that is ultimately used in determining the appropriate bit decision from the available L paths, see Balatsoukas-Stimming et al. in reference 2 above. As may be appreciated by one of skill in the art, any of the decoding processes described herein may be implemented according to a SCL decoding methodology. Additionally, a concatenated SCL decoding methodology may be employed.

Polar Codes

Polar codes form a class of linear block codes described by a generator matrix, G. Polar codes of block lengths N may be generated according to:

$$G = F_N \triangleq (F_2)^{\otimes n}$$

Where $F_N$ denotes the Kronecker product of $$F_2 = \begin{pmatrix} 1 & 0 \\ 1 & 1 \end{pmatrix},$$

among other possibilities.

A polar code is defined by the location of k information bits and (N-k) frozen bits in a block of length, N. The code rate, $$R = \frac{k}{N}$$

is expressed as the ratio of non-frozen bits to the block length. The code rate can be adjusted linearly by varying the number of non-frozen bits per block. Typically, the block length, N, is chosen to be a power of two, such that $N=2^n$, where n is a natural number.

Figure 12:
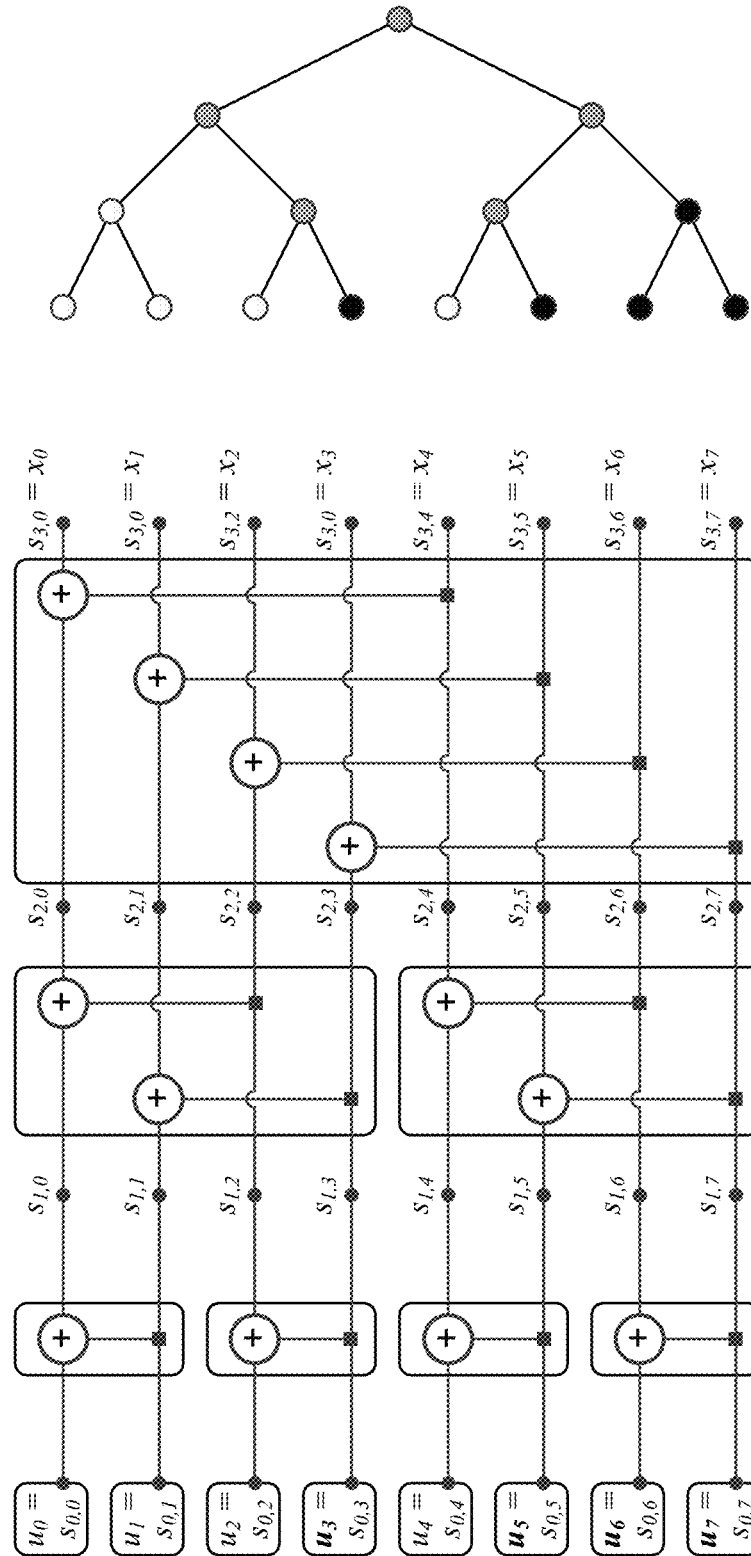
FIG. 12 illustrates an example polar encoder, where n=3.

FIG. 12—Exemplary Polar Encoder

FIG. 12 shows a sample polar code construction for block length $N=2^3$. The encoder begins with inputs, $u_i$, which are encoded into outputs, $x_i$. Information bits are shown in bold. The remaining inputs may be assigned frozen bit values, 0. At each stage, s, the encoder combines pairs of bits according to the encoding tree shown to the right, where $\oplus$ indicates an exclusive-OR (XOR) operation.

SC Decoder

The SCL decoder may be viewed as a collection of SC decoders, each employing independent min-sum calculations on a row of the accumulated log likelihood ratio (LLR) statistics. In some embodiments, an SC decoder may proceed as follows:

At each bit position, i, the SC decoder aims to estimate the bit $u_i$ as follows:

$$\hat{u}_i \triangleq \begin{cases} 0, & \text{if } i \in A_c, \\ 0, & \text{if } \ln\left(\frac{Pr(y, \hat{u}_0^{i-1}) \mid u_i = 0}{Pr(y, \hat{u}_0^{i-1}) \mid u_i = 1}\right) \geq 0, \text{ where } \ln\left(\frac{Pr(y, \hat{u}_0^{i-1}) \mid u_i = 0}{Pr(y, \hat{u}_0^{i-1}) \mid u_i = 1}\right) \\ 1, & \text{otherwise} \end{cases}$$

computes the log likelihood ratio (LLR) at bit position, i, for the estimated information vector, $\hat{u}$, given received symbol, y, and previously decoded bits $\{\hat{u}_0, \hat{u}_1, \ldots, \hat{u}_{i-1}\}$, and $A_c$ indicates the frozen bit positions.

Figure 13:
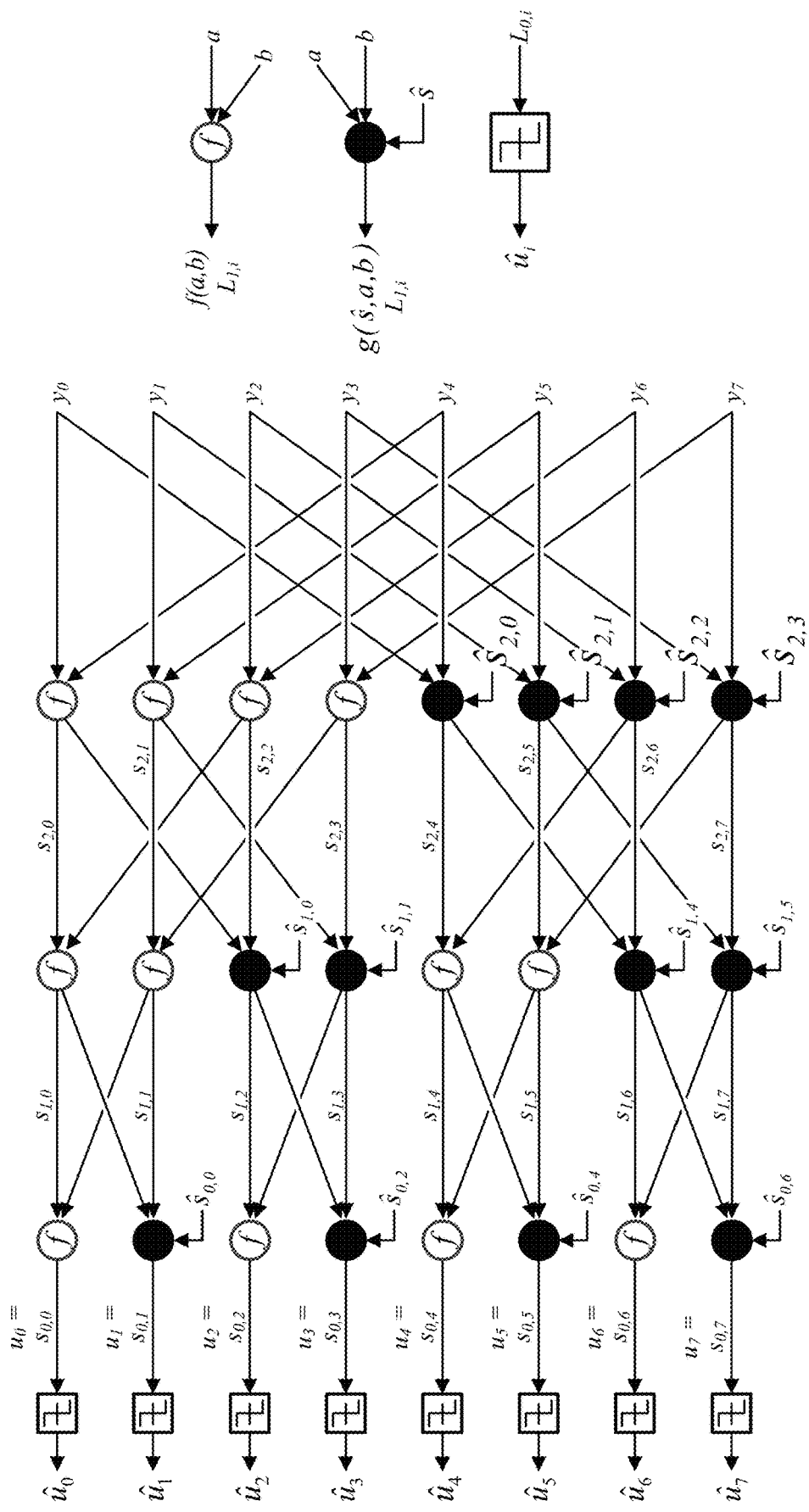
FIG. 13 illustrates an example polar decoder, where n=3.

FIG. 13 shows an example decoder where n=3, so that the block length $N=2^3$.

The decoder algorithm is applied recursively to the multi-stage diagram illustrated in FIG. 13 according to the following:

$$\lambda_{l,i} \triangleq \begin{cases} \lambda_f(\lambda_{l+1,i}; \lambda_{l+1,i+2}^{n-l-1}), & \text{if } \frac{i}{2^l} \text{ is even} \\ \lambda_g(\hat{s}_{L,z}; \lambda_{l+1,i}; \lambda_{l+1,i+2}^{n-l-1}), & \text{otherwise} \end{cases}$$

Where $\lambda_{1,i}$ denotes the LLR of row i and stage 1 of the SC decoder graph. The associated kernel calculations constitute the min-sum algorithm:

$$\lambda_f(\lambda_a, \lambda_b) = \text{sgn}(\lambda_a) \cdot \text{sgn}(\lambda_b) \cdot \min(|\lambda_a|, |\lambda_b|)$$

$$\lambda_g(\hat{s}, \lambda_a, \lambda_b) = \lambda_a(-1)^{\hat{s}} + \lambda_b$$

SCL Decoder

A list decoder may depart from the baseline SC decoder with the introduction of a path metric update. At the completion of each bit-decoding stage, path metrics may be updated accounting for the possibility of both possible bit values: $\hat{u}_i=0$ and $\hat{u}_i=1$. In some embodiments, a sorting operation may be performed to rank the paths in the list by their likelihood of being a correctly decoded string. The 'tree' of possible paths may then be pruned, retaining only the L most likely paths. The cycle of LLR calculations and path extension and pruning may be repeated for each bit in a transmission block, at which point the most likely path is chosen, revealing the best estimate of the payload data bits.

The SCL decoders described in reference 2 above use the results of the sorting operation to direct multiple memory copies (memcpy), adding processing overhead as the LLR updates cannot resume until the memcpy operations have completed.

DCI Blind Detection

In some embodiments, user identification is based on an assigned C-RNTI (Cell Radio Network Temporary Identifier). Embodiments herein describe methods to discriminate blocks intended for the present user versus those intended for another user early in the course of block decoding.

In some embodiments, cell-specific scrambling is used to mitigate the effects of adjacent cell interference.

In some embodiments, methods described herein may function at signal-to-noise ratios (SNRs) below that for the accompanying shared data channels. Additionally, some embodiments may reduce the false alarm rate (FAR) compared to previous implementations.

Candidate Search Spaces

LTE defines a set of Control Channel Element (CCE) locations for a UE to interrogate in search of intended Physical Downlink Control Channel (PDCCH) communications. The set of CCE locations are divided into UE Specific Search Spaces (UESS) and Common Search Spaces (CSS) as indicated in Table 1.

TABLE 1

LTE DCI Search Spaces

| Search Space | Aggregation Level (L) | Size (in CCEs) | No. of PDCCH Candidates | No. of Candidate Blind Decodes |
|---|---|---|---|---|
| UESS | 1 | 6 | 6 | 12 |
|  | 2 | 2 | 6 | 12 |
|  | 4 | 8 | 2 | 4 |
|  | 8 | 16 | 2 | 4 |
|  | UESS: |  | 16 | 32 |
| CSS | 4 | 16 | 4 | 8 |
|  | 8 | 16 | 2 | 4 |
|  | CSS: |  | 6 | 12 |
|  | Total: |  |  | 44 |

With LTE, each UE may receive up to 2 DCI formats from UESS per Transmission Time Interval (TTI). One reference DCI format, e.g. format 0/1A, is typically expected regardless of the transmission mode configured for the UE. Defined to have the same payload size, the reference DCI formats may require a single decoding attempt per candidate location regardless of the underlying format type. Each UE may require one additional decoding attempt per UESS candidate location for one of DCI formats 1, 1B, 1D, 2, 2A, 2B, depending upon the configured transmission mode, every TTI. A UE may then require 16×2=32 blind decoding attempts to monitor all UESS candidate locations for two different possible DCI formats per TTI.

DCI formats 0/1A and 3/3A (if TPC-PUCCH-RNTI or TPC-PUSCH-RNTI is configured), specified to have the same payload size, may require one blind decoding attempt per candidate PDCCH location in the CSS. An additional decoding attempt is needed per candidate location in the CSS for DCI format 1C when the UE is required to receive PDCCH scrambled with the SI-RNTI (System Information), P-RNTI (Paging), or RA-RNTI (Random Access), resulting in 6×2=12 blind decoding attempts across the available CSS candidate locations. In total, up to 12+32=44 blind decoding attempts may be required per TTI to monitor both the CSS and UESSS for the assigned DCI formats. Because each of the up to 44 blind decoding attempts requires considerable time and computational resources, enabling early termination during the blind decoding process may considerably improve the user experience.

Figure 14:
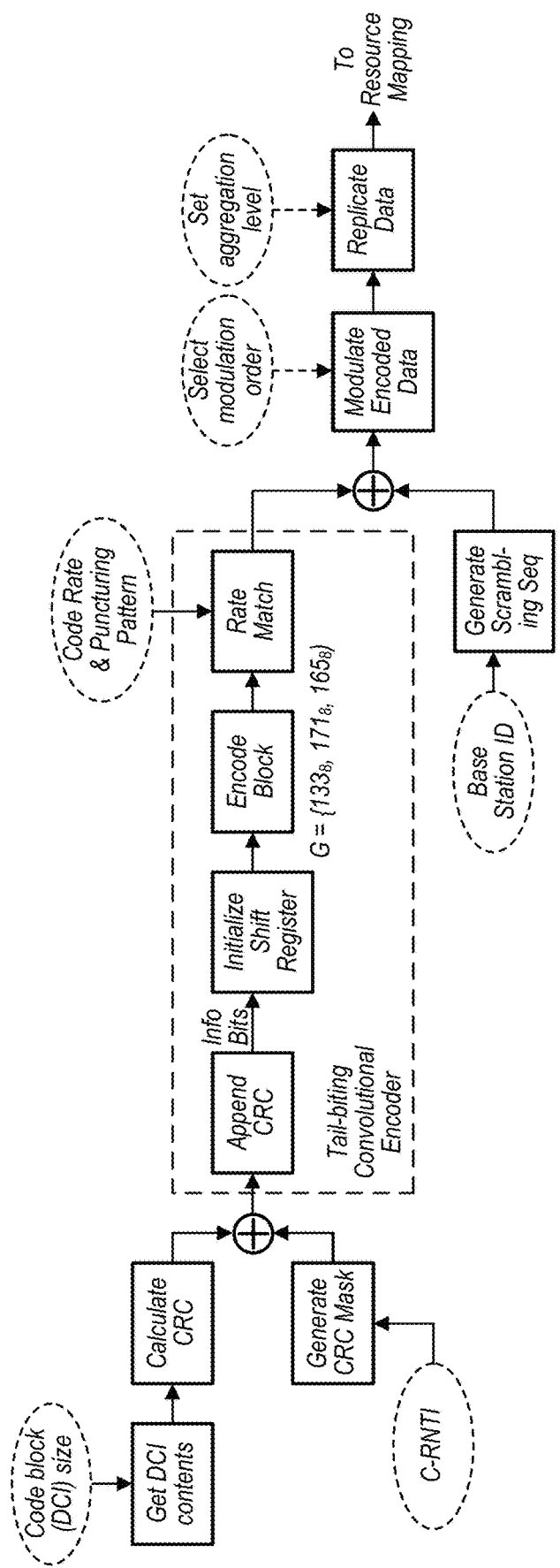
FIG. 14 is a flowchart diagram illustrating DCI encoding as prescribed for LTE.

FIG. 14—Block Discrimination

FIG. 14 illustrates DCI encoding as prescribed for LTE. LTE employs two methods of block discrimination on DCI detection as depicted in FIG. 14, which as explained in further detail below (e.g., in reference to FIG. 15), may be superimposed on the polar code structure. FIG. 14 illustrates a tail-biting convolutional encoder, which may be replaced by a polar code methodology for block discrimination, according to some embodiments.

Figure 16:
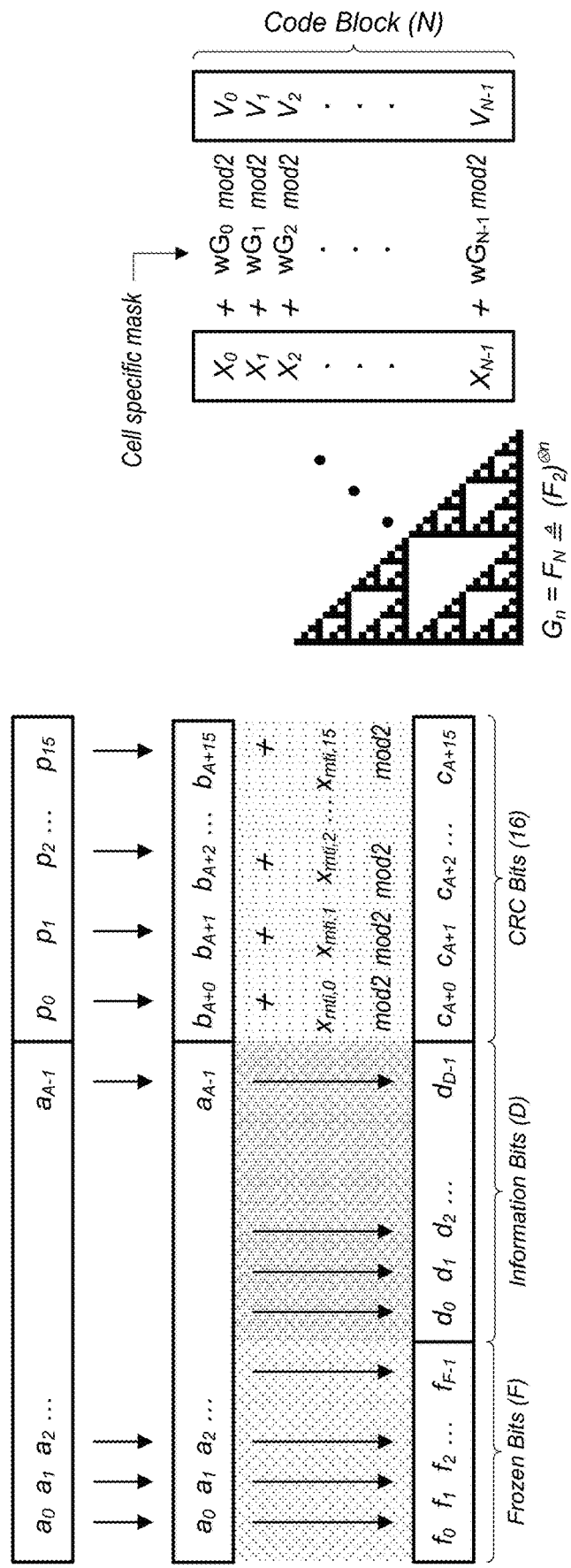
FIG. 16 illustrates bit-mask assignment patterned after that used by LTE, according to some embodiments.

First, a user-specific CRC mask may be applied at the end of each PDCCH and provides block separation based on UE ID. Second, a cell-specific scrambling mask may be applied at the encoder output to modulate the output message based on CELL ID, where the encoder is represented in FIG. 16 by an icon of the nth Kronecker power matrix, Gn.

Polar Code Construction for PDCCH

Taking the underlying polar code structure into account, embodiments described herein perform a multi-mode discrimination mask that can be adapted to a downlink control channel.

The proposed sequence design starts with a conventional Polar Code construction where a code of length $N=2^n$ assigns k information bits (inclusive of CRC and/or Parity Check (PC) bits), $A \subset [N]$, and N-k frozen bits, $F=[N]\backslash A$, the assigned values of which are known a priori to the receiver. The code rate, $R=k/N$, is determined by the number of user data dependent information bits relative to the block size.

In some embodiments, individual fields of the underlying polar code can be assigned to facilitate block discrimination according to some or all of the following three methodologies.

First, as explained above, a 16-bit CRC may be appended to each PDCCH for error detection. The CRC may be scrambled with a UE-specific mask to enable identification of which PDCCH(s) are intended for a given UE upon interrogating the list of candidate PDCCH locations.

Secondly, as explained above, a UE ID, or bit values derived from a function of the UE ID, may be inserted in the frozen bit field to additionally permit a UE to discriminate early in the course of block decoding the PDCCH(s) intended for it from those destined for another user. As a form of early termination, UE ID insertion is intended to reduce energy expended decoding blocks not meant for the present UE.

Third, as explained above, the information bits may be masked with a cell-specific mask (CELL ID mask) to mitigate the effects of adjacent-cell interference.

Figure 15:
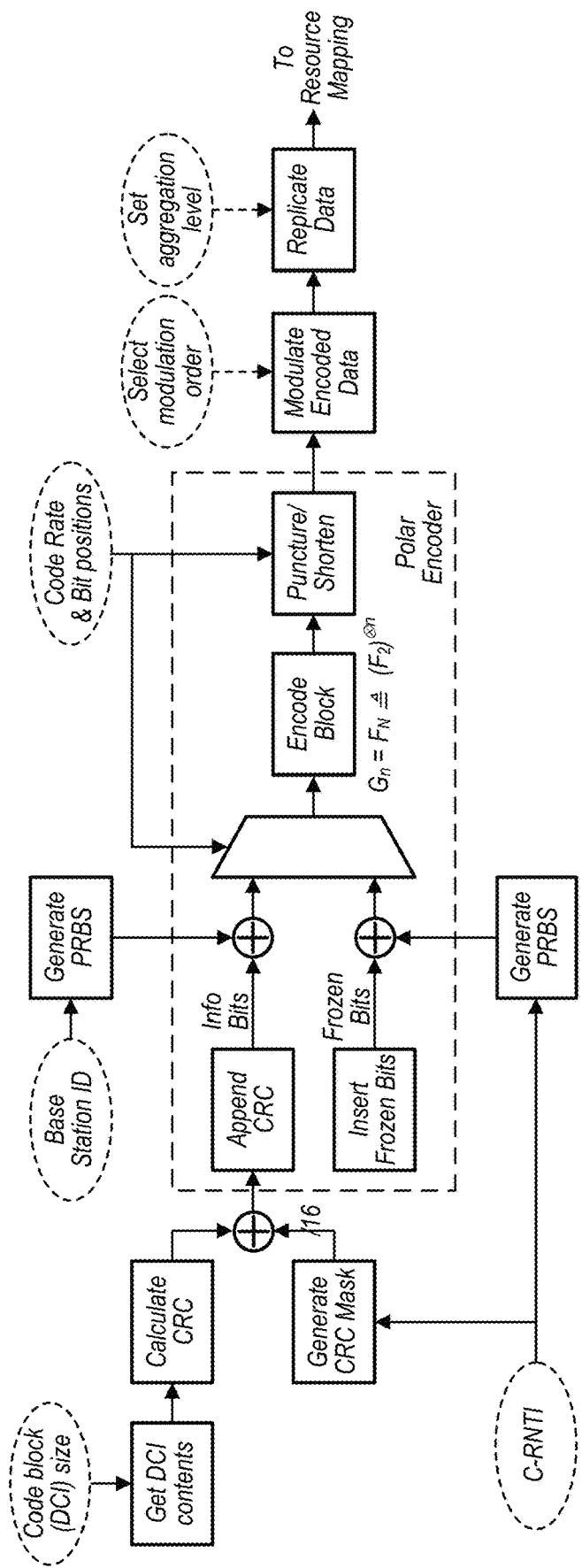
FIG. 15 is a flowchart diagram illustrating DCI encoding adapted to incorporate polar codes, according to some embodiments.

FIG. 15—Bit Mask Assignment

FIG. 15 illustrates DCI adapted to incorporate polar codes (potentially in NR), according to some embodiments. FIG. 15 illustrates the separate application of bit masks to each of frozen bits, information bits, and CRC bits, respectively, in a polar coded message. As illustrated, the multi-mode mask assignment separately uses different subsets of the bit field for separate identification purposes.

Given a linear transform, application of the Kronecker matrix can be distributed to relate the assigned bit mask(s) to the encoder output:

$$(w+u)G = wG + uG,$$

Here plus (+) represents a bit-wise XOR of the resulting scrambling mask, wG, computed once per DCI instance, with the original encoder output, uG. The bit masks, $s_{0:F-1}$, $r_{0:D-1}$, $c_{rnti,0:15}$, applied in succession at the encoder input as illustrated in FIG. 16 are equivalent to the scrambling mask, wG, applied at the encoder output, where $0_{0:M-1}$ represents an all zero vector of length M, and G relates a scrambling mask, w, at the encoder input to the encoder output. The combined mask can be similarly removed at the receiver prior to decoding. Properties assigned to a mask at the encoder input manifest equivalently in a corresponding mask applied at the encoder output. Individual attributes can be assigned so that each mask produces an intended effect as referenced to the construction at the encoder input. The mask contributions may then be combined, encoded, and then applied at the encoder output without loss in effectiveness.

Figure 17:
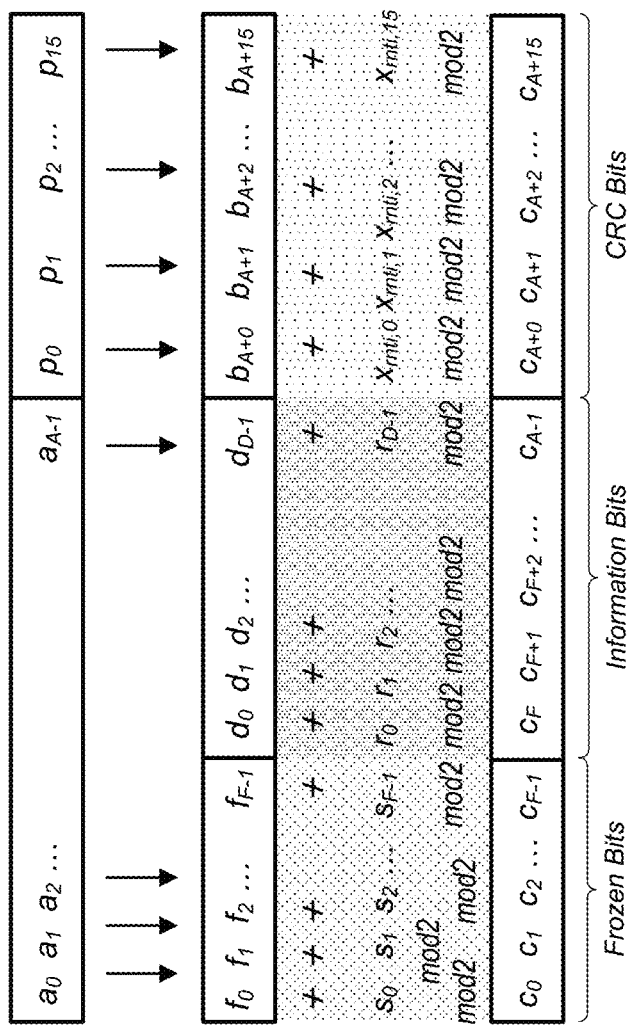
FIG. 17 illustrates a proposed NR bit-mask assignment, according to some embodiments.

FIGS. 17-18: Successive Bit-Mask Assignment

FIGS. 17-18 illustrate bit-mask assignment patterned after that used by LTE, according to some embodiments. In traditional LTE, pseudorandom sequence generation is adapted for a variety of purposes (See reference 3). An exemplary method for generating a pseudorandom sequence is illustrated here to indicate that this method or one similar can be applied to fill the frozen bit contents, the initialization of which is based on the representation of the UE ID. The method of pseudorandom sequence generation specified by LTE may be adapted to form the frozen bit contents initialized by C-RNTI to facilitate early discrimination with DCI blind detection. In some embodiments, a second application may form the information bit mask initialized on the CELL ID.

$$c_n = (x_{n+N_c}^{(1)} + x_{n+N_c}^{(2)}) \bmod 2, n=0,1,\ldots,M_{PN}-1$$

Here $N_c=1600$ and $M_{PN}$ is determined by the number of affected frozen bits.

Sequences $x_n^1$ and $x_n^2$ may be generated as follows:

$$x_{n+31}^{(1)} = (x_{n+3}^{(1)} + x_n^{(1)}) \bmod 2, n=0,1,\ldots,M_{PN}+N_c-31$$

$$x_{n+31}^{(2)} = (x_{n+3}^{(2)} + x_{n+2}^{(2)} + x_{n+1}^{(2)} + x_n^{(2)}) \bmod 2, n=0,1,\ldots,M_{PN}+N_c-31$$

Here $x_n^1$ and $x_n^2$ may be initialized as follows:

$$x_0^{(1)} = 1, x_n^{(1)} = 0, n = 1, 2, \ldots, 30$$

$$\Sigma_0^{30} x_n^{(2)} \cdot 2^n = c_{init} = \left\lfloor \frac{n_s}{2} \right\rfloor \times 2^9 + N_{ID}^{UE}$$

The frozen bit contents are filled according to:

$w_m = c_n$, where $m \in F$ beyond the first information bit

Extending the pseudorandom sequence length to the number of available frozen bits provides early user separation in a deterministic and reliable manner. If the entirety of the frozen bit contents are populated with the UE ID-derived pseudorandom sequence, a reliable and efficient means of early block discrimination may be obtained. Similarly, a pseudorandom sequence may be derived from the CELL ID and applied as a bit mask to the information portion of the block. Additionally or alternatively, the CRC may be masked based on the assigned RNTI as is done in LTE. After applying the appropriate zero padding and then summing the masks, their combined effect may be applied in a single scrambling sequence at the encoder output.

FIG. 19—Early Block Discrimination Based on UE ID Frozen Bit Assignment

FIG. 19 illustrates data for an early termination procedure of frozen bit decoding, for the case of both a match and a mismatch between the encoding and decoding UE ID.

Given a UE ID derived frozen bit assignment, early block discrimination may amount to Maximum Likelihood (ML) sequence detection. A match in the asserted frozen bit position yields a positive accumulation, while a mismatch yields a negative accumulation. A predominance of positive accumulation as seen by a moving average (MA) provides a reliable means to discriminate those blocks meant for the current user from those meant for another user. This tendency persists even at low SNR, as shown in FIG. 19.

For the purposes of block discrimination, the best LLRs are taken to be the set seen at each bit position as belonging to the best path, i.e. the path exhibiting the smallest path metric. There is no assertion that the perceived best path during the course of block decoding will survive as the remaining best path. However, indication of the perceived best path may prove useful in deriving metrics to facilitate early discrimination.

As illustrated in FIG. 19, a moving average of the best LLRs exhibits an increasing trend upon match in frozen bit assignment and trends downward when there is a mismatch in expected bit assignment. Referring again to FIG. 19, the top two plots correspond to a mismatch in frozen bit assignment between encoder and decoder. As expected, the accumulated LLRs exhibit a sharp downward trend as the number of negative matches begins to accumulate. The onset of this downturn is a function of the length of the applied moving average. It occurs earlier with a shorter moving average and later with a longer moving average.

Examining a match in encoder/decoder frozen bit assignment, we observe that the LLR accumulation is largely positive. This observation is again a function of the length of the applied moving average (MA). As illustrated in the bottom two plots of FIG. 19, a relatively short moving average, e.g. MA[8], MA[16], is susceptible to short-lived fluctuations rendering the metric less reliable for block discrimination. Ultimately, a tradeoff can be found in MA size that balances power savings due to early block discrimination and the reliability of the mechanism used to make that determination.

FIG. 20—Effect of Bit Feedback on Match Identification

FIG. 20 illustrates the effect of erroneous feedback on the match identification procedure. A mismatch in frozen bit assignment has a secondary effect related to expected decoder operation. The SC and SCL decoders are characterized by a succession of f and g-operators. While the f-operator depends solely on input LLRs, the g-operator output is conditioned on the preceding bit estimates:

$$f(a, b) = minsum(a, b);$$

$$g(\hat{s}, a, b) = \begin{array}{l} b - a, \quad \hat{s} = 1 \\ b + a, \quad \text{else} \end{array}$$

If a portion of the previously estimated bits, fed back in the form of partial sums to the g-operator, are in error due to a mismatch in frozen bit assignment, the downstream LLRs may be affected as well in a manner that is incremental to disturbance due to the channel itself. The data in FIG. 20 is taken at relatively high SNR, and as illustrated the LLRs in the bottom right-hand plot predominantly trend in the positive direction whereas those in the upper right-hand plot show the disruptive effects of the channel coupled with erroneous feedback in the g-operator. Erroneous feedback in the g-operator propagates to downstream bit decoding, frozen and info-bits alike, further reducing FAR should an unintended PDCCH elude early termination and make its way to a final CRC check. In particular, the effects of frozen bit mismatch persist even in the event that the scrambling mask is removed prior to the start of decoding.

Figure 21:
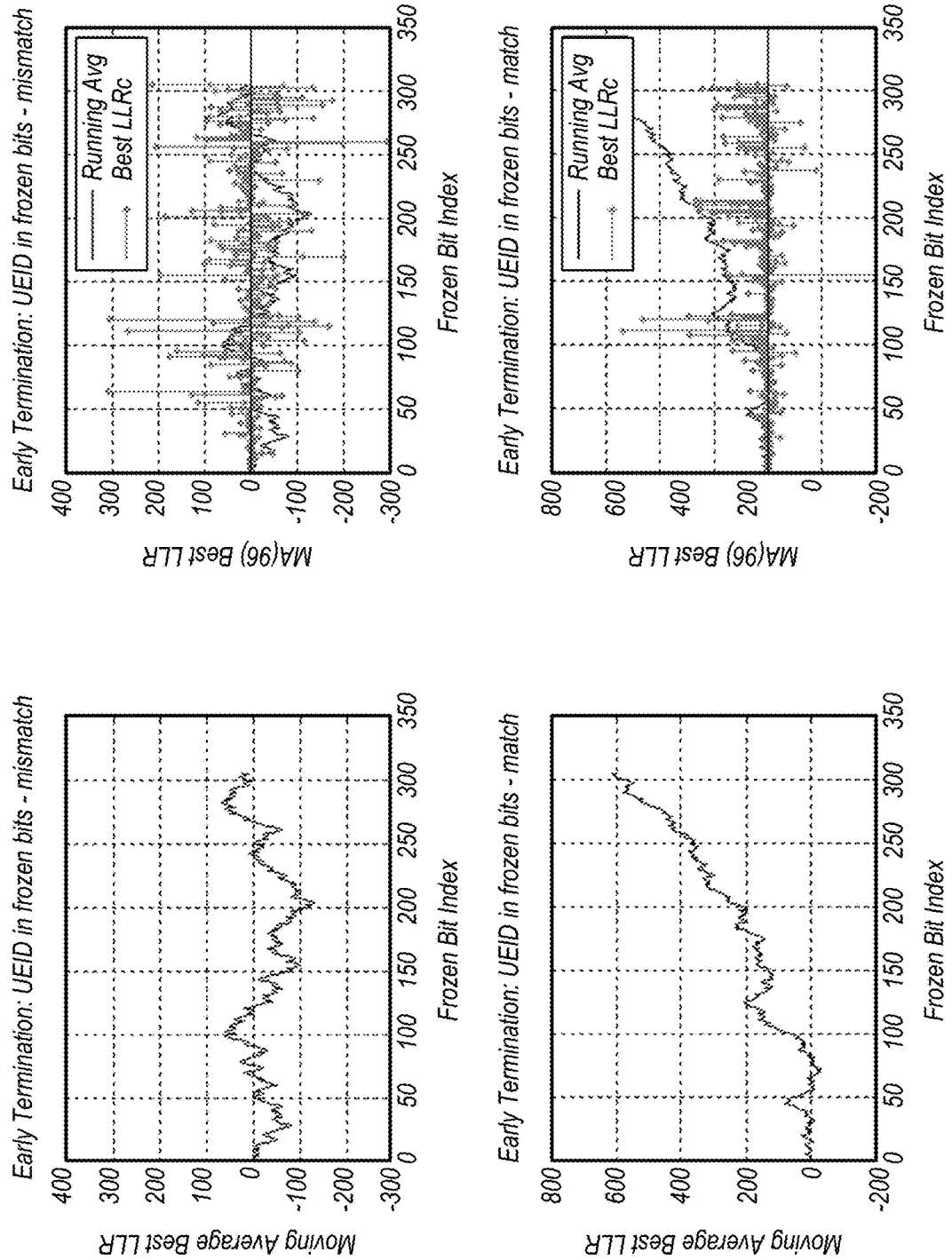
FIG. 21 illustrates the combined effects of sequence mismatch and error propagation for early termination for a mismatch (top) and a match (bottom), according to some embodiments.

FIG. 21—Combined Effects of Sequence Mismatch and Error Propagation

FIG. 21 illustrates how the combined effects of sequence mismatch and error propagation due to g-operator feedback give rise to heuristics that may prove useful for early block discrimination. In particular, the moving average of the best LLR for a UE ID mismatch (top) oscillates between positive and negative values without exhibiting a clear positive trend, while the moving average of the best LLR for a UE ID match (bottom) steadily climbs as a function of the frozen bit index.

CONCLUSIONS

Embodiments herein describe a method of frozen bit assignment that may be used in polar code construction to facilitate early block discrimination on DCI blind detection. The proposal leverages a property unique to polar codes that permits use of frozen bit contents to convey user ID, and/or information bit contents to convey CELL ID. The structure is further leveraged to provide cell separation in a manner that meets the objectives set for LTE. The end result is a scrambling sequence that enables both CELL ID and UE ID with the added benefit of early termination. Replicated at the decoder, this imprinting is useful in discerning blocks intended for a particular receiver amid multiple candidate PDCCHs, most of which are destined by design for some other user.

The reliability of block determination, including the decision to abandon decoding, improves as a function of bit position in accordance with the underlying channel reliability. The approach is compatible with PC, CRC or hybrid methods of code construction still under consideration. The proposed method of embedding UE ID imposes minimal changes in presumed encoder and decoder implementations. It further provides wide latitude in algorithm design, permitting receiver manufacturers to trade power savings for reliability of early termination.

Embodiments of the present disclosure may be realized in any of various forms. For example, in some embodiments, the present invention may be realized as a computer-implemented method, a computer-readable memory medium, or a computer system. In other embodiments, the present invention may be realized using one or more custom-designed hardware devices such as ASICs. In other embodiments, the present invention may be realized using one or more programmable hardware elements such as FPGAs.

In some embodiments, a non-transitory computer-readable memory medium may be configured so that it stores program instructions and/or data, where the program instructions, if executed by a computer system, cause the computer system to perform a method, e.g., any of the method embodiments described herein, or, any combination of the method embodiments described herein, or, any subset of any of the method embodiments described herein, or, any combination of such subsets.

In some embodiments, a computing device may be configured to include a processor (or a set of processors) and a memory medium, where the memory medium stores program instructions, where the processor is configured to read and execute the program instructions from the memory medium, where the program instructions are executable to implement any of the various method embodiments described herein (or, any combination of the method embodiments described herein, or, any subset of any of the method embodiments described herein, or, any combination of such subsets). The device may be realized in any of various forms.

Although specific embodiments have been described above, these embodiments are not intended to limit the scope of the present disclosure, even where only a single embodiment is described with respect to a particular feature. Examples of features provided in the disclosure are intended to be illustrative rather than restrictive unless stated otherwise. The above description is intended to cover such alternatives, modifications, and equivalents as would be apparent to a person skilled in the art having the benefit of this disclosure.

The scope of the present disclosure includes any feature or combination of features disclosed herein (either explicitly or implicitly), or any generalization thereof, whether or not it mitigates any or all of the problems addressed herein. Accordingly, new claims may be formulated during prosecution of this application (or an application claiming priority thereto) to any such combination of features. In particular, with reference to the appended claims, features from dependent claims may be combined with those of the independent claims and features from respective independent claims may be combined in any appropriate manner and not merely in the specific combinations enumerated in the appended claims.

What is claimed is:

1. A receiver, comprising:
a radio; and
a processor coupled to the radio;
wherein the processor and the radio are configured to:
receive a first polar coded message in a wireless manner from a transmitter, the first polar coded message comprising an encoding of a plurality of frozen bits and a plurality of information bits;
implement a decoding procedure on the first polar coded message, wherein, in implementing the decoding procedure, the receiver is configured to:
begin a decode of the first polar coded message to produce a subset of the frozen bits;
calculate a moving average of a number of matches between the subset of frozen bits and a corresponding subset of reference bits, wherein the reference bits are based on an identifier of the receiver; and
abort the decoding procedure based on a determination that the moving average is below a threshold.

2. The receiver of claim 1,
wherein a size of the moving average is determined to balance a reliability and a latency associated with the decoding procedure.

3. The receiver of claim 1,
wherein the reference bits are a pseudorandom sequence of bits generated from the identifier of the receiver, wherein the pseudorandom sequence of bits is the same length as the plurality of frozen bits.

4. The receiver of claim 1,
wherein the subset of the plurality of frozen bits is selected to balance a reliability and a latency associated with the decoding procedure.

5. The receiver of claim 1,
wherein the first polar coded message is received and the decoding procedure is initiated as part of a downlink blind detection procedure.

6. The receiver of claim 1,
wherein the processor and the radio are further configured to:
receive a second polar coded message in a wireless manner from the transmitter; and
subsequent to aborting the decoding procedure on the first polar coded message, implement the decoding procedure on the second polar coded message.

7. The receiver of claim 1,
wherein the processor comprises a plurality of parallelized processing elements;
wherein the radio and the processor are further configured to:
receive one or more additional polar coded messages in a wireless manner from the transmitter; and
implement, by separate ones of the parallelized processing elements; the decoding procedure on each of the received one or more additional polar coded messages.

8. The receiver of claim 1,
wherein the processor comprises a plurality of parallelized processing elements;
wherein the decoding procedure comprises a successive cancellation list (SCL) decoding procedure; and
wherein separate ones of the plurality of parallelized processing elements are configured to perform decoding procedures on separate respective bit paths of the SCL decoding procedure.

9. The receiver of claim 1,
wherein, in implementing the decoding procedure on the first polar coded message, the receiver is further configured to:
continue the decode of the first polar coded message to produce the plurality of information bits based on a determination that the moving average is above the threshold.

10. A method for decoding control information, comprising:
by a receiver:
receiving a first polar coded message in a wireless manner from a transmitter, the first polar coded message comprising an encoding of a plurality of frozen bits and a plurality of information bits;
implementing a decoding procedure on the first polar coded message by:
beginning decoding the first polar coded message to produce a subset of the frozen bits;
calculating a moving average of a number of matches between the subset of frozen bits and a corresponding subset of reference bits, wherein the reference bits are based on an identifier of the receiver; and
aborting the decoding procedure based on a determination that the moving average is below a threshold.

11. The method of claim 10,
wherein a size of the moving average is determined to balance a reliability and a latency associated with the decoding procedure.

12. The method of claim 10,
wherein the reference bits are a pseudorandom sequence of bits generated from the identifier of the receiver, wherein the pseudorandom sequence of bits is the same length as the plurality of frozen bits.

13. The method of claim 10,
wherein the first polar coded message is received and the decoding procedure is initiated as part of a downlink blind detection procedure.

14. The method of claim 10, the method further comprising:
receiving a second polar coded message in a wireless manner from the transmitter; and
subsequent to aborting the decoding procedure on the first polar coded message, implementing the decoding procedure on the second polar coded message.

15. The method of claim 10,
wherein the receiver comprises a plurality of parallelized processing elements;
wherein the method further comprises:
receiving one or more additional polar coded messages in a wireless manner from the transmitter; and
implementing, by separate ones of the parallelized processing elements;
the decoding procedure on each of the received one or more additional polar coded messages.

16. The method of claim 10,
wherein the receiver comprises a plurality of parallelized processing elements,
wherein the decoding procedure comprises a successive cancellation list (SCL) decoding procedure, and
wherein said implementing the decoding procedure comprises implementing, by separate ones of the plurality of parallelized processing elements, the decoding procedure on separate respective bit paths of the SCL decoding procedure.

17. The method of claim 10, wherein implementing the decoding procedure further comprises:
continuing decoding the first polar coded message to produce the plurality of information bits based on a determination that the moving average is above the threshold.

18. A non-transitory computer-readable memory medium storing program instructions which, when executed by one or more processors of a receiver, cause the receiver to:
receive a first polar coded message in a wireless manner from a transmitter, the first polar coded message comprising an encoding of a plurality of frozen bits and a plurality of information bits;
implement a decoding procedure on the first polar coded message, wherein implementing the decoding procedure comprises causing the receiver to:
begin decoding of the first polar coded message to produce a subset of the frozen bits;
calculate a moving average of a number of matches between the subset of frozen bits and a corresponding subset of reference bits, wherein the reference bits are based on an identifier of the receiver; and
abort the decoding procedure based on a determination that the moving average is below a threshold.

19. The non-transitory computer-readable memory medium of claim 18,
wherein a size of the moving average is determined to balance a reliability and a latency associated with the decoding procedure.

20. The non-transitory computer-readable memory medium of claim 18,
wherein the one or more processors comprise a plurality of parallelized processing elements,
wherein the decoding procedure comprises a successive cancellation list (SCL) decoding procedure, and
wherein said implementing the decoding procedure comprises implementing, by separate ones of the plurality of parallelized processing elements, the decoding procedure on separate respective bit paths of the SCL decoding procedure.

* * * * *